(12) United States Patent
Mathew et al.

(10) Patent No.: US 8,569,130 B2
(45) Date of Patent: Oct. 29, 2013

(54) FORMING AIR GAPS IN MEMORY ARRAYS AND MEMORY ARRAYS WITH AIR GAPS THUS FORMED

(75) Inventors: James Mathew, Boise, ID (US); Gordon Haller, Boise, ID (US); Ronald A. Weimer, Boise, ID (US); John Hopkins, Boise, ID (US); Vinayak K. Shamanna, Boise, ID (US); Sanjeev Sapra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 144 days.

(21) Appl. No.: 13/192,763

(22) Filed: Jul. 28, 2011

(65) Prior Publication Data

US 2013/0026600 A1    Jan. 31, 2013

(51) Int. Cl.
*H01L 21/336* (2006.01)

(52) U.S. Cl.
USPC ............... 438/257; 438/211; 257/E21.209; 257/E21.613; 257/314

(58) Field of Classification Search
USPC ......... 438/201, 211, 257, 587, 588, 592, 593, 438/594; 257/314, 315, E29.17, E21.209, 257/E21.613
See application file for complete search history.

(56) References Cited

U.S. PATENT DOCUMENTS

| | | | |
|---|---|---|---|
| 6,406,975 B1 | 6/2002 | Lim et al. | |
| 6,492,245 B1 | 12/2002 | Liu et al. | |
| 6,613,652 B2 | 9/2003 | Lim et al. | |
| 6,727,157 B2 | 4/2004 | Seo | |
| 7,229,894 B2 | 6/2007 | Koh | |
| 7,400,024 B2 | 7/2008 | Kunnen | |
| 7,670,924 B2 | 3/2010 | Demos et al. | |
| 7,682,900 B2 * | 3/2010 | Kim et al. | 438/257 |
| 7,855,123 B2 | 12/2010 | Lee et al. | |
| 2002/0094651 A1 | 7/2002 | Farrar | |
| 2004/0152278 A1 | 8/2004 | Farrar | |
| 2007/0184615 A1 * | 8/2007 | Brazzelli et al. | 438/266 |
| 2008/0124917 A1 | 5/2008 | Oh et al. | |
| 2008/0283898 A1 | 11/2008 | Kuniya | |
| 2009/0212352 A1 | 8/2009 | Aoyama et al. | |
| 2010/0015813 A1 | 1/2010 | McGinnis et al. | |

(Continued)

FOREIGN PATENT DOCUMENTS

| KR | 20040070799 | 11/2004 |
|---|---|---|
| KR | 20050011498 | 1/2005 |

(Continued)

OTHER PUBLICATIONS

E. Kunnen, et al., "Introduction of Airgap Deeptrench Isolation in STI Module for High Speed SiGe: C BiCMOS Technology," MRS Materials Research Society (1 page).

(Continued)

*Primary Examiner* — David Vu
(74) *Attorney, Agent, or Firm* — Leffert Jay & Polglaze, P.A.

(57) ABSTRACT

Methods of forming air gaps in memory arrays and memory arrays with air gaps thus formed are disclosed. One such method may include forming an isolation region, having a first dielectric, through a charge-storage structure that is over a semiconductor, the isolation region extending into the semiconductor; forming a second dielectric over the isolation region and charge-storage structure; and forming an air gap in the isolation region so that the air gap passes through the charge-storage structure and so that a thickness of the first dielectric is between the air gap and the second dielectric.

28 Claims, 16 Drawing Sheets

(56) References Cited

U.S. PATENT DOCUMENTS

| | | |
|---|---|---|
| 2010/0176368 A1 | 7/2010 | Ko et al. |
| 2010/0295113 A1 | 11/2010 | Kang et al. |
| 2011/0186918 A1 | 8/2011 | Sung |
| 2011/0303967 A1 | 12/2011 | Harari et al. |
| 2011/0309425 A1 | 12/2011 | Purayath et al. |
| 2012/0126306 A1 | 5/2012 | Kawaguchi et al. |

FOREIGN PATENT DOCUMENTS

| | | |
|---|---|---|
| KR | 100856614 | 8/2008 |
| TW | 486773 | 5/2002 |
| WO | WO 2011/160001 A1 | 12/2011 |

OTHER PUBLICATIONS

A Bicksler, et al.; "Memory Array With an Air Gap Between Memory Cells and the Formation Thereof"; U.S. Appl. No. 12/862,107, filed Aug. 24, 2010; Total pp. 31.

C. Hsieh, et al., "Damascene Process for Air-Gap Cu Interconnects Using Sacrificial Layer HSQ", Solid-State and Integrated Circuit Technology, 2006, ICSICT 2006, pp. 336-338.

K. Ysukamoto, et al. "Advanced Air Gap Process for Multi-Level-Cell Flash Memories Reducing Threshold Voltage Interference and Realizing High Reliability," Abstract, Japanese Journal of Applied Physics, vol. 46, 2007.

* cited by examiner

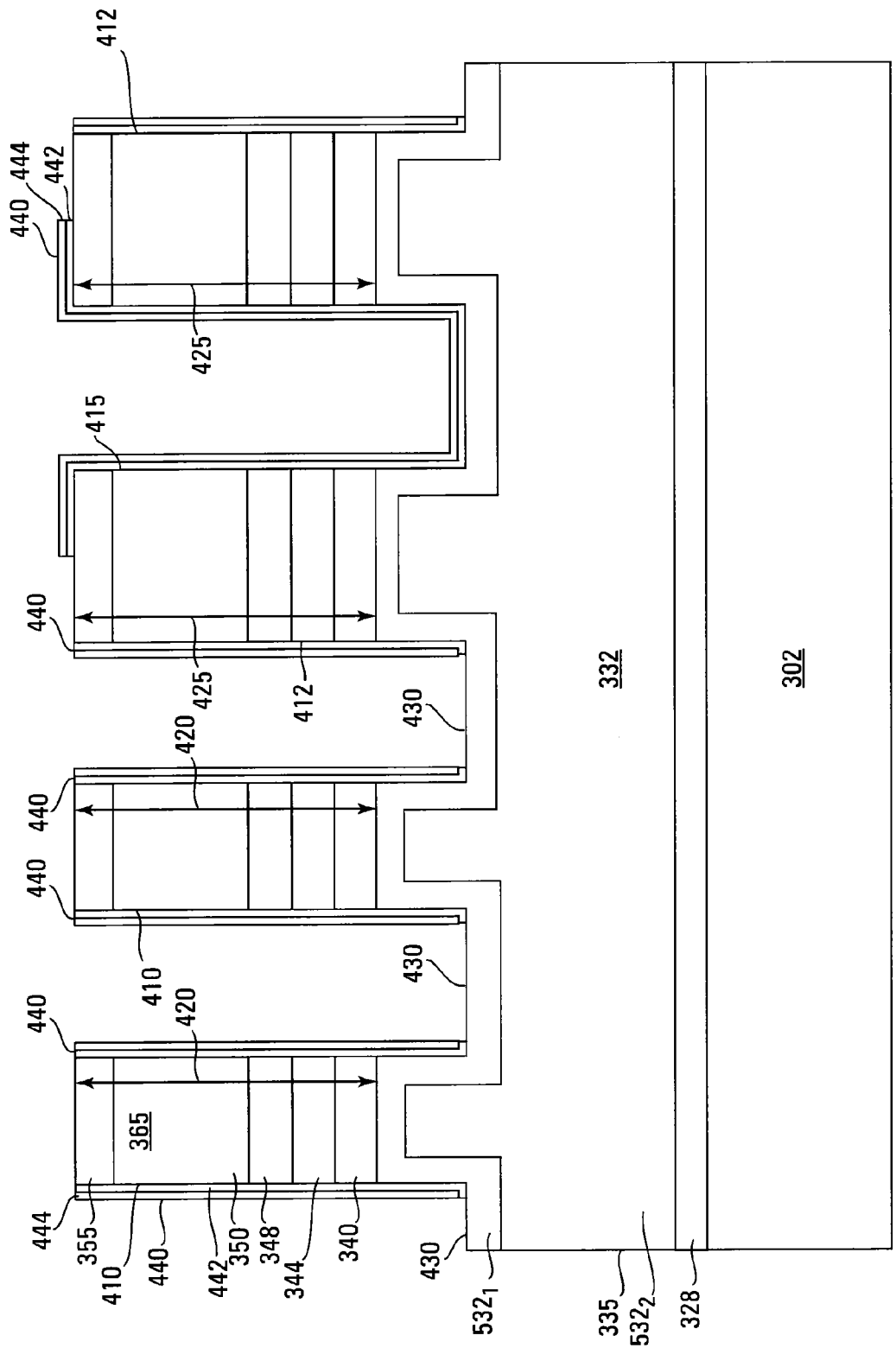

US 8,569,130 B2

FORMING AIR GAPS IN MEMORY ARRAYS AND MEMORY ARRAYS WITH AIR GAPS THUS FORMED

FIELD

The present disclosure relates generally to memories and in particular, in one or more embodiments, the present disclosure relates to forming air gaps in memory arrays and memory arrays with air gaps thus formed.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

In a NOR flash architecture, a column of memory cells are coupled in parallel with each memory cell coupled to a data line, such as a bit line. A "column" refers to a group of memory cells that are commonly coupled to a local data line, such as a local bit line. It does not require any particular orientation or linear relationship, but instead refers to the logical relationship between memory cell and data line.

Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

In order for memory manufacturers to remain competitive, memory designers are constantly trying to increase the density of memory devices. Increasing the density of a flash memory device generally requires reducing the spacing between memory cells that can increase the capacitive coupling (e.g., termed parasitic capacitance) between adjacent memory cells, such as between the memory cells in adjacent columns, e.g., in the word-line direction or the direction diagonal the word-line direction. For example, a capacitive coupling may exist between the charge-storage structure of a memory cell and adjacent memory cells, e.g., that may affect the threshold voltage, and thus the programmed data value, of the memory cell.

For the reasons stated above, and for other reasons stated below which will become apparent to those skilled in the art upon reading and understanding the present specification, there is a need in the art for alternative techniques for reducing the capacitive coupling between adjacent memory cells.

BRIEF DESCRIPTION OF THE DRAWINGS

FIGS. 4A-4B show cross-sections viewed along line 4/6-4/6 in FIG. 3A and FIG. 4C is a cross-section viewed along line 4C-4C in FIG. 3B.

FIGS. 5A-5B are cross-sectional views of a portion of a memory array during various stages of fabrication, according to another embodiment.

FIGS. 6A-6D show cross-sections viewed along line 4/6-4/6 in FIG. 3A and FIGS. 6E-6F show cross-sections viewed along line 6E/6F-6E/6F in FIG. 7.

DETAILED DESCRIPTION

Figure 1:
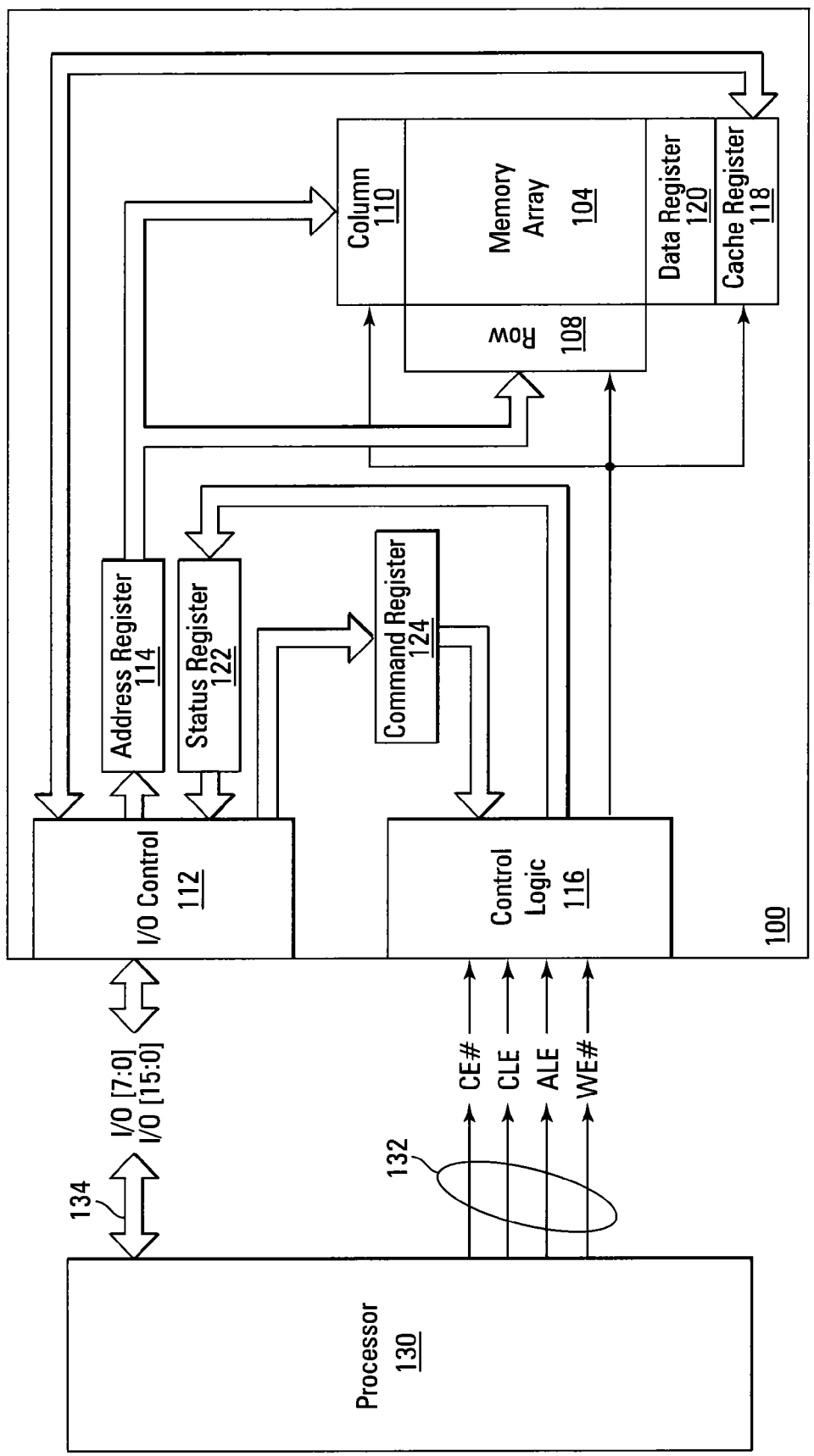
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, chemical and electrical changes may be made without departing from the scope of the present disclosure. The following detailed description is, therefore, not to be taken in a limiting sense.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a simplified block diagram of a NAND flash memory device 100 in communication with a processor 130 as part of an electronic system, according to an embodiment. The processor 130 may be a memory controller or other external host device.

Memory device 100 includes an array of memory cells 104 formed in accordance with embodiments of the disclosure. That is, memory array 104 may include air-containing gaps formed in accordance with embodiments of the disclosure. For example, the air gaps thus formed may be between adjacent columns of memory cells, e.g., in the data-line (e.g., bit-line) direction, and may act to reduce the capacitive coupling between the charge-storage structures of adjacent memory cells.

Although these gaps are referred to herein as air-containing gaps, or simply air gaps, it will be understood that the air gaps as defined herein may contain one or more gaseous components other than, or in addition to, ambient air. For example, an air gap as defined herein may contain oxygen, nitrogen, argon, neon or other gas compatible (e.g., inert) with the surrounding structures, or a gas containing a mixture of one or more such gaseous components. For one or more embodiments, the gas contained in an air gap of the present disclosure may further be below atmospheric pressure.

A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
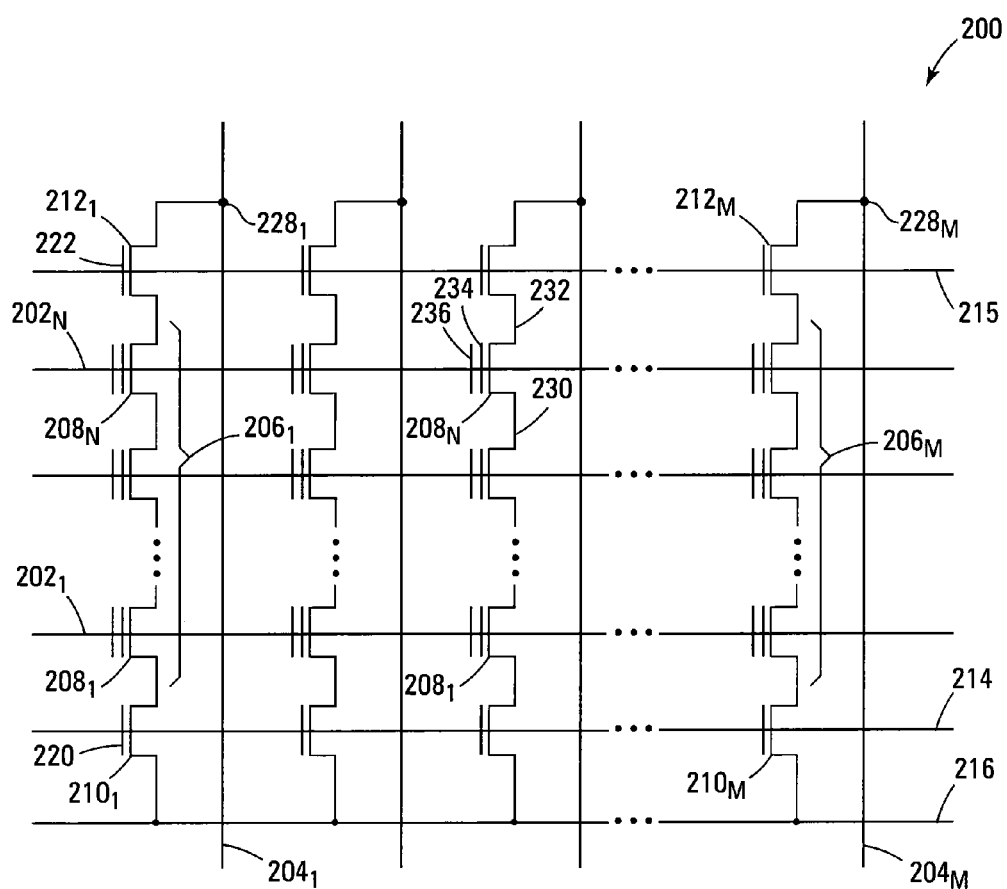
FIG. 2 is a schematic of a NAND memory array, according to another embodiment.

FIG. 2 is a schematic of a NAND memory array 200, e.g., as a portion of memory array 104, in accordance with another embodiment. Memory array 200 includes access lines, such as word lines $202_1$ to $202_N$, and intersecting data lines, such as bit lines $204_1$ to $204_M$. For ease of addressing in the digital environment, the number of word lines 202 and the number of bit lines 204 are each some power of two, e.g., 256 word lines 202 by 4,096 bit lines 204. The bit lines 204 may coupled to global data lines, such as global bit lines (not shown), in a many-to-one relationship.

Memory array 200 is arranged in rows (each corresponding to a word line 202) and columns (each corresponding to a bit line 204). Each column may include a string, such as one of NAND strings $206_1$ to $206_M$. Each NAND string 206 is coupled to a common source line 216 and includes memory cells $208_1$ to $208_N$, each located at an intersection of a word line 202 and a bit line 204. The memory cells 208 represent non-volatile memory cells for storage of data. The memory cells 208 of each NAND string 206 are connected in series, source to drain, between a source select line 214 and a drain select line 215.

Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the memory cells 208 of each NAND string 206 are connected between a source select gate 210 and a drain select gate 212.

A source of each source select gate 210 is connected to common source line 216. The drain of each source select gate 210 is connected to the source of the memory cell 208 of the corresponding NAND string 206. For example, the drain of source select gate $210_1$ is connected to the source of memory cell $208_1$ of the corresponding NAND string $206_1$. Therefore, each source select gate 210 selectively couples a corresponding NAND string 206 to common source line 216. A control gate 220 of each source select gate 210 is connected to source select line 214.

The drain of each drain select gate 212 is connected to the bit line 204 for the corresponding NAND string at a drain contact 228. For example, the drain of drain select gate $212_1$ is connected to the bit line $204_1$ for the corresponding NAND string $206_1$ at drain contact $228_1$. The source of each drain select gate 212 is connected to the drain of the last memory cell $208_N$ of the corresponding NAND string 206. For example, the source of drain select gate $212_1$ is connected to the drain of memory cell $208_N$ of the corresponding NAND string $206_1$. Therefore, each drain select gate 212 selectively couples a corresponding NAND string 206 to a corresponding bit line 204. A control gate 222 of each drain select gate 212 is connected to drain select line 215.

Typical construction of memory cells 208 includes a source 230 and a drain 232, a charge-storage structure 234 (e.g., a floating gate, charge trap, etc.) that can store a charge that determines a data value of the cell, and a control gate 236, as shown in FIG. 2. Memory cells 208 have their control gates 236 coupled to (and in some cases from) a word line 202. A column of the memory cells 208 is a NAND string 206 coupled to a given bit line 204. A row of the memory cells 208 are those memory cells commonly coupled to a given word line 202.

Although the examples of FIGS. 1 and 2 were discussed in conjunction with NAND flash, the embodiments described herein are not limited to NAND flash, but can include other flash architectures, such as NOR flash, etc.

Figure 3A:
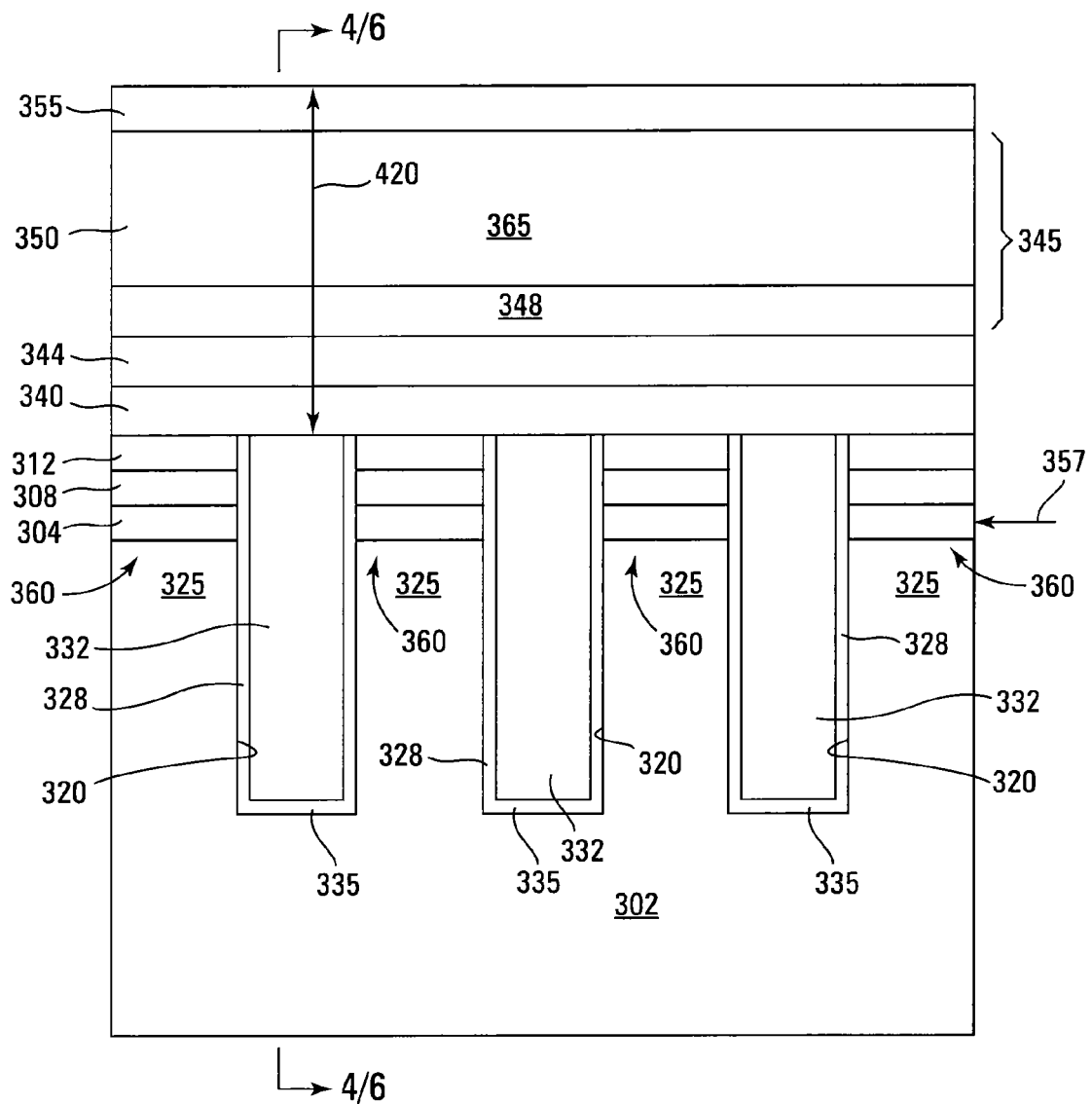
FIGS. 3A-3B are cross-sectional views of a portion of a memory array during various stages of fabrication, according to another embodiment.
Figure 3B:
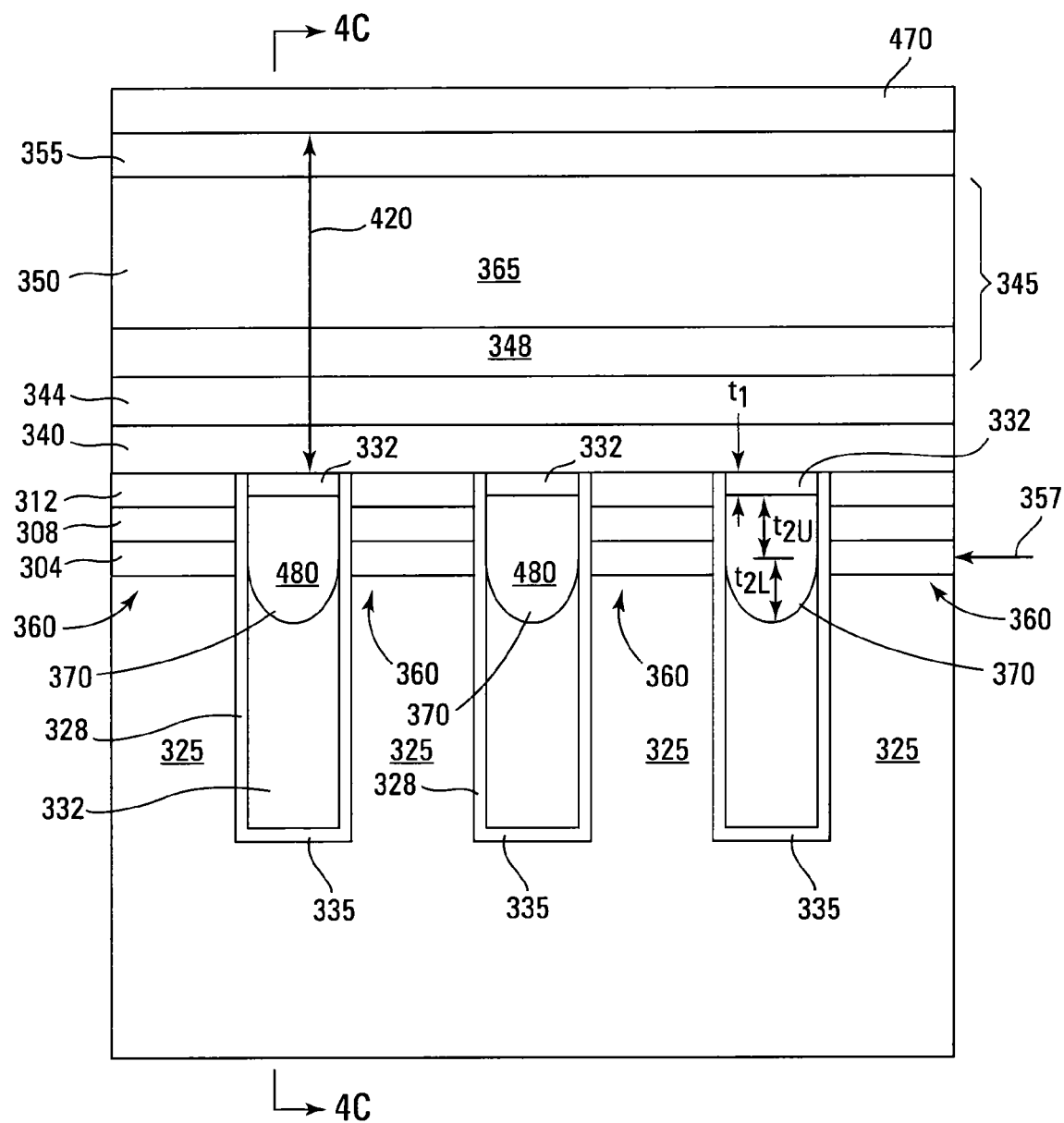
Figure 4A:
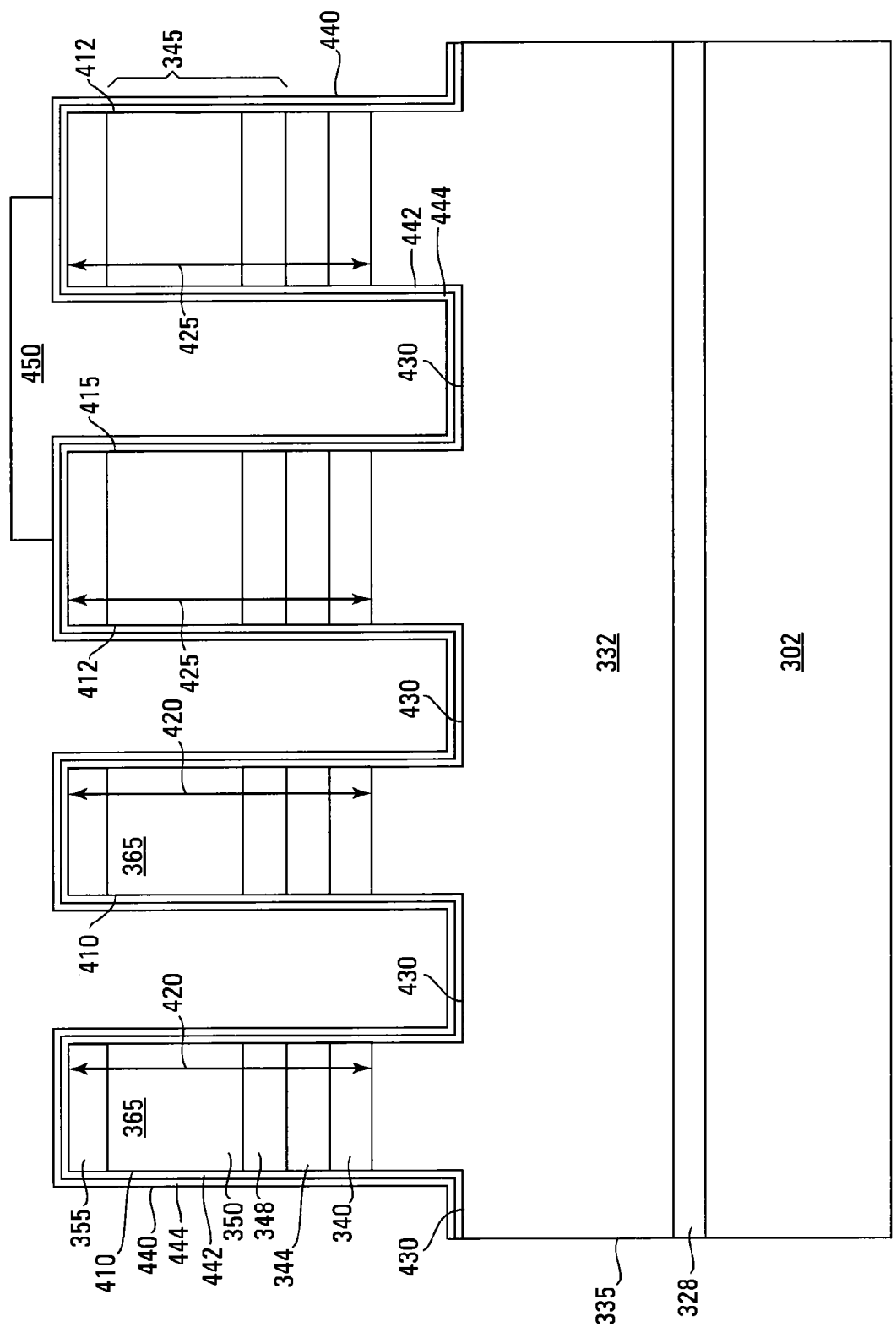
FIGS. 4A-4C are cross-sectional views of the portion of the memory array of FIGS. 3A and 3B during various stages of fabrication, according to another embodiment, where
Figure 4B:
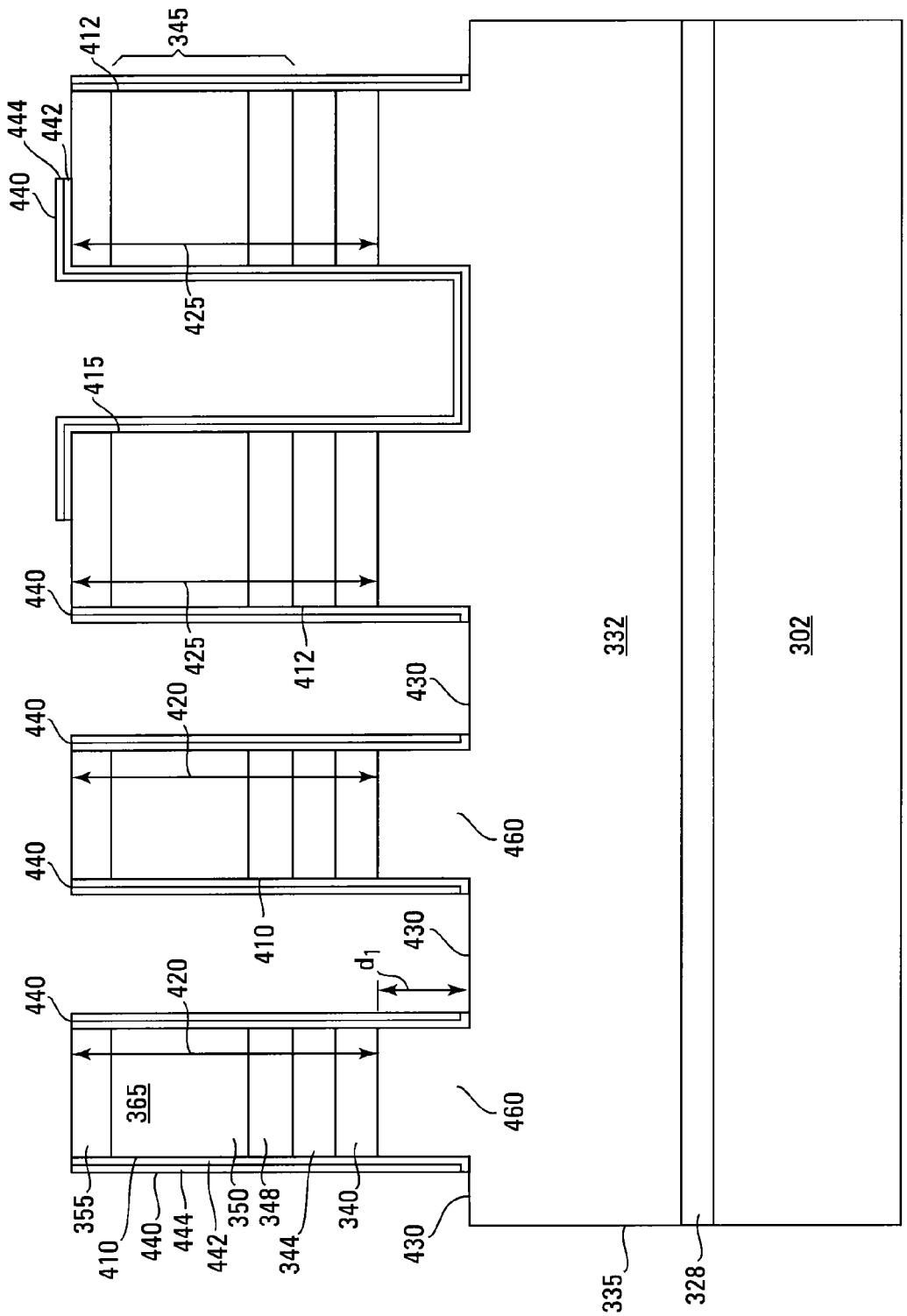
Figure 4C:
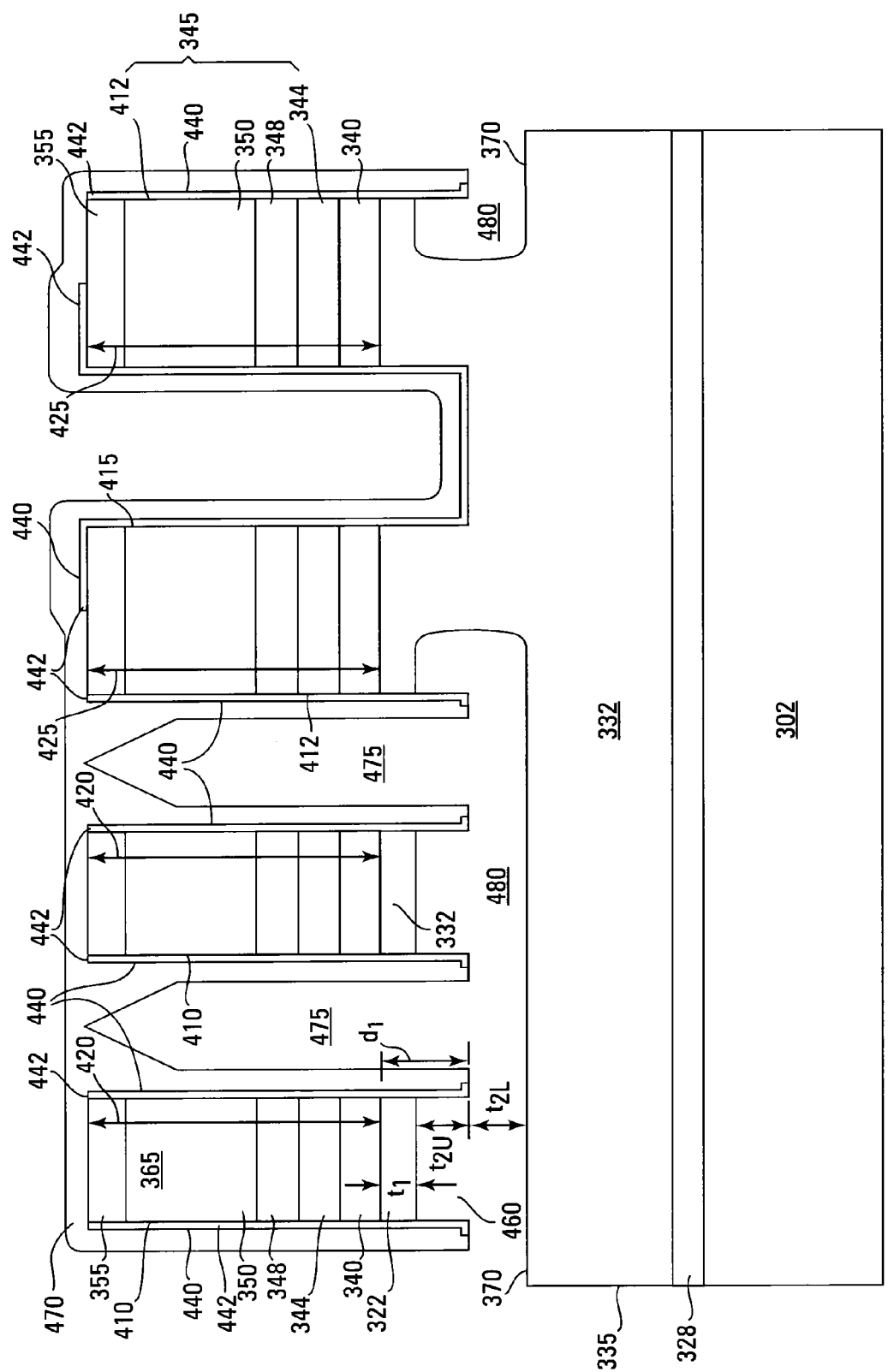

FIGS. 3A-3B are cross-sectional views of a portion of a memory array, such as a portion of the memory array 200 of FIG. 2, e.g., along an access-line (e.g., word-line) direction, such as a row direction, during various stages of fabrication. FIGS. 4A-4C are cross-sectional views of the portion of the memory array in FIGS. 3A and 3B, e.g., along a data-line (e.g., bit-line) direction, such as a column direction, during various stages of fabrication. FIGS. 4A-4B show a cross-section viewed along line 4/6-4/6 in FIG. 3A during the various stages of fabrication, and FIG. 4C is a cross-section viewed along line 4C-4C in FIG. 3B.

In general, for some embodiments, a dielectric 304 (e.g., a tunnel dielectric) may be formed over a semiconductor 302, as shown in FIG. 3A. Semiconductor 302 may be comprised of silicon, e.g., monocrystalline silicon, that may be conductively doped to have p-type conductivity, e.g., to form a p-well, or n-type conductivity, e.g., to form an n-well. Dielectric 304 is generally formed of one or more dielectric materials. For example, dielectric 304 may be formed from an oxide, e.g., silicon oxide, an oxynitride, e.g., silicon oxynitride, etc.

A charge-storage structure 308 may be formed over dielectric 304. Charge-storage structure 308 is generally formed of one or more materials capable of storing a charge. Charge-storage structure 308 may be a floating gate formed from a conductor. The conductor may comprise, consist of, or consist essentially of conductively doped polysilicon and/or may comprise, consist of, or consist essentially of metal, such as a refractory metal, or a metal-containing material, such as a refractory metal silicide, or a metal nitride, e.g., a refractory metal nitride, as well as any other conductive material. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

For other embodiments, charge-storage structure 308 may be a charge trap. For example, the charge trap may be a dielectric, e.g., a high-dielectric-constant (high-K) dielectric, such as alumina ($Al_2O_3$) having a K of about 10, with embedded conductive particles (e.g., nano-dots), such as embedded metal particles or embedded nano-crystals (e.g., silicon, germanium, or metal crystals), a silicon-rich dielectric, or SiON/$Si_3N_4$. Other charge-storage structures are also known.

In the example of FIG. 3A, a dielectric 312 may be formed over charge-storage structure 308. Dielectric 312 may be generally formed of one or more dielectric materials. For some embodiments, dielectric 312 may be a high-dielectric-constant (high-K) dielectric, such as alumina, hafnia ($HfO_2$), or zirconia ($ZrO_2$) with a K of about 20, or praeseodymium oxide ($Pr_2O_3$) with a K of about 30. Alternatively, dielectric 312 may be an oxide.

A sacrificial material (not shown) may be formed over dielectric 312. In general, the sacrificial material may be chosen to protect and/or pattern underlying layers while allowing their subsequent selective removal. For example, the sacrificial material may comprise, consist of, or consist essentially of one or more sacrificial materials, such as an oxide, e.g., silicon dioxide, and/or polysilicon, nitride etc.

Openings 320, such as trenches, may then be formed by patterning the sacrificial material and removing portions of dielectric 312, charge-storage structure 308, dielectric 304, and semiconductor 302 exposed by the patterned sacrificial material. For example, for some embodiments, a mask (not shown), e.g., imaging resist, such as photo-resist, may be formed over the sacrificial material and patterned to define regions of the sacrificial material, dielectric 312, charge-storage structure 308, dielectric 304, and semiconductor 302 for removal. The regions defined for removal are subsequently removed, e.g., by etching, to form openings 320 that may terminate within semiconductor 302.

Openings 320 may extend substantially in the column direction (e.g., substantially perpendicular to the face-plane of FIGS. 3A-3B and substantially parallel to the face-plane of FIGS. 4A-4C). Openings 320 define active regions 325 therebetween under dielectric 302 within semiconductor 302, as shown in FIG. 3A. Each active region 325 may form a channel region for a corresponding column of memory cells, e.g., a string of series coupled memory cells, to be formed thereover. In other words, during operation of one or more memory cells of a column of memory cells, such as a string of memory cells, a channel can be formed in the corresponding active region 325.

For some embodiments, openings 320 may be lined with a dielectric (e.g., a dielectric liner) 328, e.g., that may cover side surfaces of dielectric 304, charge-storage structure 308, and dielectric 312. Dielectric 328 is generally formed of one or more dielectric materials, such as an oxide (e.g., silicon dioxide) that may be a high-density oxide and that may be deposited using chemical vapor deposition.

Dielectric 328 may be formed by a high-aspect-ratio process (HARP). Dielectric 328 may be nitrided oxide (e.g., formed by the HARP). For example, dielectric 328 may be an oxide treated with a decoupled plasma nitridation (DPN) process. DPN processing can reduce the wet-etch rate of an oxide, for example, to as much about 62 percent of a spin-on-dielectric, such as hydrogen silsesquioxane (HSQ), perhydropolysilazane, etc.

A dielectric 332 may be formed in openings 320 over dielectric 328 and possibly over the sacrificial material, such as by blanket deposition. A portion of dielectric 332, the sacrificial material, and a portion of dielectric 328 may then be removed, stopping on or within dielectric 312. For some embodiments, upper surfaces of dielectric 332 and ends of dielectric 328 may be substantially flush (e.g., flush) with an upper surface of dielectric 312. For example, the upper surfaces of dielectric 332 and the ends of dielectric 328 may be planarized, e.g., using CMP. For some embodiments, the dielectric 328 and the dielectric 332 remaining in each opening 320 may form an isolation region 335, such as a shallow trench isolation (STI) region, in the respective opening 320.

Dielectric 332 is generally formed of one or more dielectric materials, e.g., having a higher isotropic etch rate than surrounding materials, such as dielectric 328, e.g., so that dielectric 332 may be removed without encroaching on (e.g., damaging) dielectric 328. For example, dielectric 332 may be a spin-on dielectric having a suitably high wet-etch rate, such as hydrogen silsesquioxane (HSQ), perhydropolysilazane, etc., relative to the wet-etch rate of surrounding materials, such as dielectric 328. Alternatively, dielectric 332 may be a dielectric having a suitably high dry-etch rate, such as a carbon-rich oxide, relative to the dry-etch rate of surrounding materials, such as dielectric 328. The carbon-rich oxide may contain 5 atomic percent to 85 atomic percent carbon.

In the example of FIG. 3A, a dielectric 340, such as an oxide, e.g., silicon dioxide, may then be formed over dielectric 312 and isolation regions 325, e.g., dielectric 332 and the ends of dielectric 328. Dielectric 340 may be generally formed of one or more dielectric materials. For some embodiments, dielectric 340 may be an oxide such a silicon dioxide. Alternatively, dielectric 312 may be a nitride.

A dielectric 344 may then be formed over dielectric 340. Dielectric 344 may be generally formed of one or more dielectric materials. For some embodiments, dielectric 344 may be a high-dielectric-constant (high-K) dielectric, such as alumina, hafnia ($HfO_2$), or zirconia ($ZrO_2$) with a K of about 20, or praeseodymium oxide ($Pr_2O_3$) with a K of about 30. Alternatively, dielectric 344 may be an oxide. Note that for embodiments where dielectrics 312, 340, and 344 may respectively be an oxide, nitride, and an oxide, dielectrics 312, 340, and 344 form an ONO structure.

A conductor 345 may then be formed over dielectric 344. Conductor 345 is generally formed of one or more conductive materials and may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material. A protective material 355, e.g., a dielectric, such as nitride, carbon, etc., may then be formed over conductor 345, e.g., for protecting conductor 345, dielectrics 344, 340, and 312, charge-storage structure 308, and dielectric 304 during the subsequent processing described below.

In the example of FIG. 3A, conductor 345 may include a conductive material 348, such as tantalum, that may be formed over dielectric 344, and a conductive material 350, such as tungsten, that may then be formed over conductive material 348. Conductive material 348 may serve as a transition material between dielectric 344, e.g., when dielectric 344 is a high-K dielectric, and conductive material 350.

A mask (not shown), e.g., imaging resist, such as photoresist, may be formed over protective material 355 and patterned to define regions of protective material 355 for removal. Portions of protective material 355, conductor 345, dielectric 344, dielectric 340, and dielectric 332 (e.g., of a corresponding isolation region 335) are then removed, as shown in FIG. 4A, stopping at a level (e.g., a vertical level) within dielectric 332, corresponding to above, below, or at the upper surface of semiconductor 302 to form openings 410, 412, and 415 through conductor 345, dielectric 344, and dielectric 340, extending into dielectric 332 and terminating at the level within dielectric 332 corresponding to above, below, or at the upper surface of semiconductor 302.

For example, the removal process may expose upper surfaces 430 of dielectric 332, where surfaces 430 of dielectric 332 are at a level (e.g., a vertical level) corresponding to a level (e.g., a vertical level) that is at about the level indicated by arrow 357 in FIG. 3A, e.g., at a level between the upper and lower surfaces of dielectric 304 in FIG. 3A, and thus below charge-storage structures 308. This means that openings 410, 412, and 415 may intersect isolations regions 335, e.g., in planes parallel to the plane of FIG. 3A, and may extend into isolation regions 335 to about the level indicated by arrow 357. For example, openings 410, 412, and 415 may be substantially perpendicular isolation regions 335.

Openings 410 may be between successively adjacent stacks 420; openings 412 may be between a stack 420 and an adjacent stack 425; and an opening 415 may be between successively adjacent stacks 425, as shown in FIG. 4A. For example, a stack 420 may be between openings 410 so that the side surfaces of that stack are adjacent to those openings 410. The stack 420 adjacent to one of stacks 425 may be between an opening 410 and an opening 412 so that the side surfaces of that stack 420 are respectively adjacent to the opening 410 and the opening 412. Each of stacks 425 may be between openings 412 and 415 so that the side surfaces of the respective stack 425 are respectively adjacent to the opening 412 and the opening 415.

Portions of conductor 345, dielectric 344, dielectric 340, dielectric 312, charge-storage structure 308, and dielectric 304 exposed by the patterned protective material 355 are also removed above each active region 325 to form memory cells 360, e.g., a column, such as a serially coupled string of memory cells 360, over each active region 325. A memory cell 360 may include dielectric 304 (e.g., as a tunnel dielectric), charge-storage structure 308 over dielectric 304, dielectrics 312, 340, and 344, e.g., forming a blocking dielectric, such as an interlayer dielectric, over charge-storage structure 308.

Each memory cell 360 may include a control gate, e.g., as a portion of or coupled to a word line. In the examples of FIGS. 3A and 4A, conductive material 350 forms access lines, such as word lines 365, and conductive material 348 may be referred to as a control gate electrode of memory cells 360. Note that protective material 355, conductor 345, dielectric 344, and dielectric 340 may each be contiguous and may each be common to a row of memory cells 360, as in the example of FIG. 3A.

Memory cells 360 may be located above and be substantially vertically aligned (e.g., vertically aligned) with active regions 325, as shown in FIG. 3A. Note that the row memory cells 360 in the example of FIG. 3A may be commonly coupled to a single word line, such as a word line 365.

In the examples of FIGS. 3A and 4A, the stacks 420, e.g., that may be referred to as access-line stacks (e.g., word-line stacks), that are formed over dielectric 332, and thus isolation regions 335, may include dielectric 340 over a corresponding isolation region 335, dielectric 344 over dielectric 340, conductor 345 (e.g., including conductive material 348 over dielectric 344 as a portion of a control gate electrode of a memory cell 360 and conductive material 350 over conductive material 348 as a portion of a word line) over dielectric 344, and protective material 355 over conductor 345. Stacks 420 may be contiguous and common to respective memory cells of a string of serially coupled memory cells, such as the memory cells 208 of a NAND string 206 of FIG. 2. For example, FIG. 3A shows a stack 420 commonly coupled to a row of memory cells 360, where each memory cell 360 may form a portion of a respective string of serially coupled memory cells.

Each stack 420 may be contiguous and common to the memory cells 360 of a row of memory cells, such as shown in FIG. 3A. Note that each memory cell 360 in the row of memory cells in FIG. 3A may include a portion of the stack 420 over dielectric 312.

Stacks 425 may be referred to as select-line stacks, in that one of stacks 425 may be coupled to a select gate at an end of a string of serially coupled memory cells, such as a drain select gate 212 in FIG. 2, and the other may be coupled to a select gate at an end of another string of serially coupled memory cells, such as a drain select gate 212 in FIG. 2. For some embodiments, conductor 345 may act as a select line of a row of select gates and may be coupled to a control gate of a corresponding select gate. Note that the select gates and stacks 425 may be formed substantially concurrently (e.g., concurrently) with the memory cells 360 and stacks 420, and that a select gate may include a portion of dielectric 304 (e.g., as a gate dielectric) and a portion of conductor 345 as a control gate. Each stack 425 may be contiguous and common to the select gates of a row of select gates, such as the row of drain select gates 212 in FIG. 2.

For some embodiments, a protective material (e.g., a protective liner) 440, e.g., a dielectric, may be formed over stacks 420 and 425 and over exposed portions of dielectric 332, and thus over exposed portions of each isolation region 335, as shown in FIG. 4A. For example, protective material 440 may be formed on the sides and the bottom (e.g., surfaces 430 of dielectric 332) of openings 410, 412, and 415 and on the upper surfaces of stacks 420 and 425. Stated in another way, protective material 440 may be formed within openings 410, 412, and 415 on side surfaces (e.g., the sidewalls) and upper surfaces (e.g., top walls) of stacks 420 and 425 and on the exposed portions of dielectric 332 and thus the isolation region 335. For example, protective material 440 may be formed on the side surfaces of dielectric 340, dielectric 344, conductive material 348 of conductor 345, and conductive material 350 of conductor 345 and on the side surfaces and upper surfaces of protective material 355.

Generally, protective material 440 may comprise, consist of, or consist essentially of one or more thicknesses of protective material, such as a thickness of oxide, e.g., silicon dioxide, and/or a thickness of nitride, such as silicon nitride, etc. For example, protective material 440 may be a thickness of oxide, e.g., high-density plasma oxide, or nitride over stacks 420 and 425 and the exposed portion of isolation region 335. Protective material 440 may be one or more thicknesses of protective material formed by the HARP. For example, protective material 440 may include an oxide and/or nitride formed by the HARP. Protective material 440 may act to protect dielectric 340, dielectric 344, conductive material 348 of conductor 345, and conductive material 350 of conductor 345 from subsequent removal processing, such as etching.

In the example of FIG. 4A, protective material 440 may include a thickness of protective material 442, such as dielectric material, e.g., oxide, silicon dioxide, high-density plasma oxide, etc., over the respective stack and exposed portion of isolation region 335 and a thickness of protective material 444, such as dielectric material, e.g., nitride, silicon nitride, etc., over the thickness of dielectric material 442. For example, protective material 440 may be formed on (e.g., in contact with) the side surfaces of dielectric 340, dielectric 344, conductive material 348 of conductor 345, and conductive material 350 of conductor 345 and on the side surfaces and upper surfaces of protective material 355. The thickness of protective material 442 and/or the thickness of protective material 444 may be formed by the HARP. The thickness of protective material 442 and/or the thickness of protective material 444 may be nitrided oxides (e.g., formed by the HARP). For example, nitrided oxides may be oxides treated with a DPN process.

A mask 450, e.g., imaging resist, such as photo-resist, may then be formed within opening 415 over protective material 440 and may extend over at least a portion of the protective material 440 formed over the upper surfaces of stacks 425, as shown in FIG. 4A. For example, mask 450 may overfill opening 415. For other embodiments, mask 450 may extend over the portion of the protective material 440 formed over the upper surfaces of stacks 425 all the way to the side surfaces of stacks 425 that bound openings 412 and that face the side surfaces of the adjacent stacks 420. In addition to protecting portions of the stacks 425 and the select gate associated therewith from subsequent removal processing, mask 450 may protect source/drain contact regions, e.g., between the select gates, and circuitry on the periphery of the memory array.

Subsequently, exposed portions of the protective material 440 in FIG. 4A are selectively (e.g., anisotropically) removed, e.g., by an anisotropic etch, such as an anisotropic dry etch in FIG. 4B. That is, the exposed portions of protective material 440 over the upper surfaces of stacks 420 and 425, e.g., the upper surfaces of protective material 355, and over surfaces 430 of dielectric 332, and thus of isolation regions 335, are selectively removed, leaving protective material 440 over (e.g., on) side surfaces of stacks 420 and side surfaces of dielectric 332 (e.g., adjacent to surfaces 430 at the bottoms of openings 410 and 412).

Protective material 440 remains on the sides of openings 410 and 412. For example, the exposed substantially horizontal portions of protective material 440 are selectively removed from the upper surfaces of stacks 420 and the bottoms of openings 410 and 412 (e.g., from surfaces 430), leaving behind the substantially vertical portions of protective material 440 (e.g., that may be referred to as protective sidewall spacers of protective material 440) over (e.g., on) the side surfaces of stacks 420 and a side surface of each of stacks 425 and side surfaces of dielectric 332. For example, the protective sidewall spacers of protective material 440 may be left on the sides of openings 410 and 412 (e.g., on the side surfaces of dielectric 340, dielectric 344, conductive material 348 of conductor 345, and conductive material 350 of conductor 345 and on the side surfaces of protective material 355). The removal process also selectively removes the exposed portion of protective material 440 over the upper surface of each stack 425, leaving behind the portion of protective material 440 on the upper surface of each stack 425 that was protected by mask 450.

For some embodiments, the protective sidewall spacers of protective material 440 may extend to the surfaces 430 of dielectric 332, as shown in FIG. 4B, so that a portion of dielectric 332 vertically under the dielectric 340 of stacks 420 is between the protective sidewall spacers of protective material 440. For example, the lower ends of the protective sidewall spacers of protective material 440 may terminate at a level (e.g., a vertical level) that is at about the level indicated by arrow 357 in FIG. 3A, e.g., at a level between the upper and lower surfaces dielectric 304 in FIG. 3A, and thus below the level of charge-storage structure 308.

The distance $d_1$ (FIG. 4B) between a surface 430 and an upper surface of dielectric 332 under dielectric 340 of stacks 420, and thus the lower ends of protective sidewall spacers of protective material 440, corresponds to a thickness of that portion of dielectric 332 vertically under dielectric 340 and between protective sidewall spacers of protective material 440 formed on the side surfaces of the corresponding stack 420, e.g., in the region 460. As such, changing the depth of openings 410 or 412 changes the thickness of dielectric 332 in region 460 vertically under dielectric 340 and between protective sidewall spacers of protective material 440. Note that this thickness of dielectric 332 may determine, at least in part, the amount of time this thickness of dielectric 332 can undergo a removal process, while still protecting dielectric 340.

The removal of protective material 440 from the bottoms of openings 410 and 412 exposes the surfaces 430 of dielectric 332, and thus isolation region 335, at the bottoms of openings 410 and 412 for subsequent removal of a portion of dielectric 332. That is, the removal of protective material 440 from the bottoms of openings 410 and 412 provides access to dielectric 332 through openings 410 and 412 for the removal of a portion of dielectric 332. Mask 450 is then removed, exposing the protective material 440 that was protected thereby during the selective removal process.

A portion of dielectric 332 is then removed, e.g., using an isotropic removal process, such as an isotropic wet etch (e.g., when dielectric 332 is a spin-on-dielectric, such as hydrogen silsesquioxane (HSQ), perhydropolysilazane, etc.) or an isotropic dry etch (e.g., when dielectric 332 is a carbon-rich oxide). As one example, the isotropic wet etch may use 100:1 hydrofluoric acid (HF), whereas the isotropic dry etch may use oxygen-rich plasma, e.g., with 10 to 100 percent oxygen by volume.

The isotropic removal process removes dielectric 332 vertically and laterally to remove dielectric 332 from under openings 410 and 412 and in regions 460 under stacks 420 and at least a portion of gate stacks 425, as shown in FIG. 4C. The isotropic removal process extends upward in region 460 under gate stacks 420 and under gate stacks 425, as well as downward, so as to remove at least some of the dielectric 332 vertically under dielectric 340 and between the protective sidewall spacers of protective material 440. Note that the thicker the dielectric 332, e.g., in regions 460, vertically under dielectric 340 the longer the upward removal of dielectric 332 vertically under dielectric 340 and the downward removal dielectric 332, and thus the deeper the openings 370 in dielectric 332 that are formed by the isotropic removal process.

The upward removal of dielectric 332 between the protective sidewall spacers of protective material 440 may form the portion of opening 370 above the level indicated by arrow 357 in FIG. 3B. Note the thicker the dielectric 332 (e.g., the greater the distance $d_1$ in FIG. 4B) vertically under dielectric 340, the longer the upward removal of dielectric 332 vertically under dielectric 340 and the corresponding downward removal dielectric 332, thus resulting in deeper openings 370 in dielectric 332, while still protecting dielectric 340. Openings 410 and 412 may open into an opening 370 and may be contiguous with that opening 370.

For some embodiments, a certain thickness $t_1$ of dielectric 332 is allowed to remain in region 460 under each stack 420, e.g., under dielectric 340, as shown in FIGS. 3B and 4C, e.g., for protecting the respective stacks 420. For example, a thickness $t_{2U}$ of dielectric 332 may be removed from the region 460 by the upward removal during the isotropic removal process, leaving the thickness t1 of dielectric 332 under dielectric 340. The thickness $t_1$ of dielectric 332 remaining under each stack 420 and region 460 may be vertically under dielectric 340 and between the protective sidewall spacers of protective material 440.

During the isotropic removal, a thickness $t_{2L}$ of dielectric 332 is removed in a downward removal. For example, during the time the thickness $t_{2U}$ of dielectric 332 is removed, the thickness $t_{2L}$ of dielectric 332 is also removed, as shown in FIGS. 3B and 4C. The isotropic removal may be terminated at a time when the thickness $t_1$ of dielectric 332 is reached, so as to avoid encroaching on dielectric 340. For example, it may be experimentally determined for given materials and removal processes that a particular time is needed to remove a particular amount of the dielectric 332 such that a thickness $t_1$ of dielectric 332 remains, or the particular time may be empirically determined through knowledge of expected removal rates for given materials and removal processes. Alternatively, the expected thickness $t_1$ of dielectric 332 remaining might be calculated directly or indirectly from the quantitative measurement of process conditions, such as the mass of reaction products removed from a reactor system.

The distance $d_1$ may be substantially equal to the thickness $t_1$ of dielectric 332 remaining plus the thickness $t_{2U}$ of dielectric 332 removed by the upward removal. This means that the larger distance $d_1$, e.g., the deeper openings 410 and 412, the longer the removal time before reaching a particular thickness $t_1$ of dielectric 332 remaining in region 460. Therefore, the thickness $t_{2L}$ of dielectric 332 that is removed by the downward removal is greater due to the longer isotropic removal time, meaning that the depth of openings 370 is greater, and thus air gaps 480 formed from openings 370 are deeper. Note that for some embodiments, the thickness $t_{2U}$ of dielectric 332 removed from the region 460 by the upward removal and the thickness $t_{2L}$ of dielectric 332 removed by the downward removal may be substantially equal.

A portion of dielectric 332 is also allowed to remain under each stack 425, e.g., under dielectric 340, as shown in FIG. 4C, e.g., for protecting the respective stacks 425. Protective material 440 on the bottom of opening 415 acts to substantially prevent at least a portion of dielectric 332 from being removed vertically under opening 415 and at least partially from under stacks 425, e.g., by etchant that is in openings 415. For example, protective material 440 may protect source/drain contact regions, e.g., between the select gates coupled to stacks 425 and circuitry on the periphery of the memory array.

The isotropic removal process also removes a portion of dielectric 332 from between successively adjacent memory cells 360 in each row of memory cells to form an opening 370 between successively adjacent memory cells 360 in each row of memory cells, as shown in the example of FIG. 3B for a portion of a row of memory cells. For example, openings 370 may be formed in isolation regions 335. FIG. 3B shows that the upward removal removes the thickness $t_{2U}$ of dielectric 332, e.g., substantially above the level indicated by arrow 357, from isolation regions 335 and that the downward removal removes the thickness $t_{2L}$ of dielectric 332, e.g., substantially below the level indicated by arrow 357, from isolation regions 335.

Note that the etchant is supplied to dielectric 332 though openings 410 and 412 while the side surfaces of stacks 410 and a side surface of each of stacks 425 are protected with the protective sidewall spacers of protective material 440. Dielectric 332 may be selected to have a higher removal rate than protective material 440 and dielectric 328 for the particular removal process, such as the wet or dry etch, so that at least a portion of dielectric 332 can be removed, while leaving protective material 440 on the side surfaces of stacks 420, leaving protective material 440 on the side surfaces and at least a portion of the upper surfaces of stacks 425, and leaving dielectric 328 on the side surfaces of at least dielectrics 304 and 312 and charge storage structures 308, as shown in FIG.

3B. In this way, protective material 440 protects the side surfaces of stacks 420 and the side surfaces and at least the portion of the upper surfaces of stacks 425; dielectric 328 protects at least the side surfaces of dielectrics 304 and 312 and charge storage structures 308; and protective material 355 protects the upper surfaces of conductor 350, e.g., word lines 365. However, some of protective material 440, dielectric 328, and protective material 355 may be removed during the isotropic removal of the dielectric 332. For some embodiments, at least a portion of the ends of protective material 440 that extend into an opening 370 may be removed.

For some embodiments, dielectric 332 may be relatively porous, e.g., relative to protective material 440, dielectric 328, and protective material 355, thereby tending to cause it to have a higher etch rate than protective material 440, dielectric 328, and protective material 355. For example, the etch rate of protective material 440 may be less than 20 percent than the etch rate of dielectric 332.

Figure 5B:
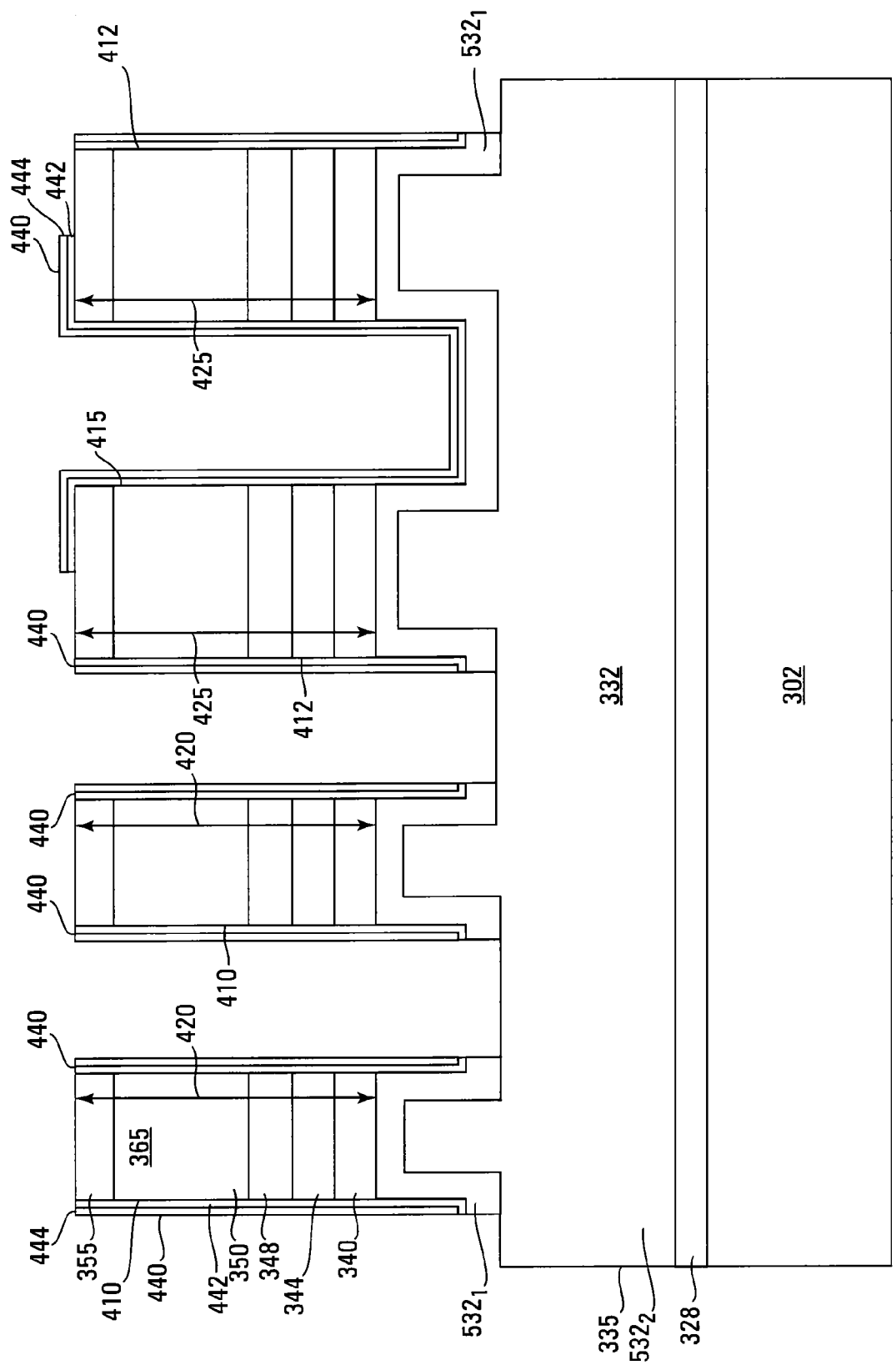

For other embodiments, a region $532_1$ (shown in FIG. 5A) of dielectric 332 adjacent to stacks 420 and 425 and adjacent to (e.g., just below) surfaces 430 of dielectric 332, may become hardened (e.g., densified), such as during processing or as the result of a rapid thermal processing (RTP) heat treatment. For example, the hardened region $532_1$ may form over a region $532_2$ of dielectric 332 that may be more porous (e.g., less dense) than region $532_1$. In such embodiments, the portion of region $532_1$ exposed by openings 410 and 412, e.g., under surfaces 430, may need to be removed in FIG. 5B, e.g., using an additional selective removal process or as part of the selective removal process that exposes surfaces 430, such as an anisotropic dry etch, prior to the formation of openings 370. This exposes region $532_2$, e.g., provides access to region $532_2$ though openings 410 and 412, for the subsequent isotropic removal of at least region $532_2$ for forming openings 370.

After removing the portion of region $532_1$, openings 370 are formed by removing at least a portion region $532_2$ isotropically to form openings 370. For some embodiments, the isotropic removal process may also remove at least some of region $532_1$. The portion of dielectric 332 that is also allowed to remain under each stack 420, as shown in FIGS. 3B and 4C, may include a portion of region $532_1$, a portion of region $532_2$, or portions of region $532_1$ and region $532_2$ for some embodiments. Note that the processing in FIGS. 5A and 5B may occur between the processing in FIGS. 4B and 4C for the examples of FIGS. 4B, 4C, 5A, and 5B.

For some embodiments, protective material 440 may be removed from openings 410, 412, and 415 and from the upper surfaces of stacks 425 after the isotropic removal of dielectric 332. That is, protective material 440 may be removed from the side surfaces of stacks 420 and from the side surfaces and upper surfaces of stacks 425. For example, protective material 440 may be removed from the side surfaces of the portion of dielectric 332 remaining under dielectric 340, dielectric 340, dielectric 344, conductive material 348 of conductor 345, and conductive material 350 of conductor 345 and from the side surfaces of protective material 355 and from the upper surfaces of the protective material of stacks 425. Stated in another way, protective material 440 may be removed from openings 410, 412, and 415, exposing the sides thereof, and from the upper surfaces of stacks 425.

For example, it may be desirable to remove protective material 440 to avoid charge trapping effects, such as when protective material 440 is one or more thicknesses of nitride. Note that for some embodiments where protective material 440 comprises, consists of, or consists essentially of nitride over oxide, e.g., the thickness of protective material 442 is oxide and the thickness of protective material 444 is nitride, the oxide may protect stacks 420 and thus the memory cells coupled thereto from the charge trapping associated with the nitride and the nitride may better protect the stacks 420 and 425 from the isotropic removal of dielectric 332 than using oxide alone. For other embodiments, the thicknesses of protective material 444 may be removed after forming openings 370, as shown in FIG. 4C, e.g., using a wet etch process selective to protective material 444. For example, in the example of FIG. 4C, protective material 440 may only include the thickness of protective material 442

A material 470, e.g., a dielectric, having a low conformability, such as plasma enhanced TEOS (tetraethylorthosilicate) or silane oxide, is then formed in openings 410 and 412, with or without protective material 440, so that material 470 pinches off adjacent to a top of each of openings 410 and 412 before openings 410 and 412 can be completely filled with material 470. Material 470 thus closes openings 410 and 412 adjacent to the tops thereof. For example, material 470 may be formed adjacent to (e.g. over) the thicknesses of protective material 442 after the thicknesses of protective material 444 are removed in the example of FIG. 4C.

For some embodiments, a thickness of material 470 may form over the sides of openings 410 and 412 (e.g. over the side surfaces of stacks 420 and a side surface of a stack 425). For example, for embodiments where protective material 440 is removed, a thickness of the material 470 may form on the side surfaces of the portion of dielectric 332 remaining under dielectric 340, dielectric 340, dielectric 344, conductive material 348 of conductor 345, and conductive material 350 of conductor 345, and on the side surfaces of protective material 355 within openings 410 and 412. Note that material 470 may form below the openings 410 and 412, such as on the dielectric 332 in openings 370, and that the material 470 may not extend all the way to the bottom of openings 410 and 412 as depicted in FIG. 4C.

In the example of FIG. 4C, the thickness of material 470 may form over the protective material 440 on the sides of openings 410 and 412, e.g., on the side surfaces of stacks 420 and a side surface of a stack 425. Openings 410 and 412 may have a relatively high aspect (height-to-width) ratio that acts to promote pinching off of material 470 adjacent the tops of openings 410 and 412. Opening 415 may have a lower aspect ratio than openings 410 and 412 so that material 470 does not pinch off, but instead forms either on the sides and bottom of opening 415, e.g., in the absence of protective material 440, or on protective material 440 formed on the sides and bottom of opening 415, as shown in FIG. 4C, thus leaving opening 415 open at the top.

Closing openings 410 and 412 at their tops forms air gaps 475 that may open into (e.g., communicate with) an opening 370. Each opening 370 may also form an air gap 480 that may communicate with air gaps 475. As such, air gaps 475 and 480 are contiguous and may be thought of as forming a single air gap. For example, an air gap may include an air gap 475 and a portion of air gap 480.

For each row of memory cells, an air gap 480 may, for example, at least be between the dielectrics 304 (e.g., corresponding to the tunnel dielectrics), between the charge storage structures 308, and between dielectrics 312 of successively adjacent memory cells 360 in a row of memory cells, as shown in FIG. 3B. Air gaps 475 may be between successively adjacent stacks 410 and between a stack 420 and a successively adjacent stack 425, as shown in FIG. 4C.

Each air gap 480 in FIG. 3B may be between an upper portion (the portion of dielectric 332 remaining under dielectric 340) and a lower portion of dielectric 332, so that the upper portion of dielectric 332 is between the air gap 480 and dielectric 340. As such, the air gap 480 may be within the corresponding isolation region 335 between upper and lower portions of dielectric 332 for some embodiments. The upper portion of dielectric 332 is also between successively adjacent memory cells 360 (e.g., between the dielectric 312 of the successively adjacent memory cells 360) of a row of memory cells, as shown in FIG. 3B.

The upper portion of dielectric 332 remaining under dielectric 340 may be contained between sidewalls of adjacent memory cells 360, e.g., between edges of dielectric 312 of adjacent memory cells 360, as shown in FIG. 3B. For some embodiments, a substantially vertical portion of dielectric liner 328 may be between an end of the upper portion of dielectric 332 and a sidewall of a memory cell 360 (e.g., the edge of dielectric 312 of that memory cell), and another substantially vertical portion of dielectric liner 328 may be between an opposite end of the upper portion of dielectric 332 and the sidewall of an adjacent memory cell 360 (e.g., the edge of dielectric 312 of the adjacent memory cell) so that the upper portion of dielectric 332 terminates at the respective substantially vertical portions of dielectric liner 328.

The substantially vertical portions of a dielectric liner 328 may be respectively adjacent to (e.g., over) sidewalls of adjacent active regions 325. The substantially vertical portions of a dielectric liner 328 may extend so that they may be respectively adjacent to (e.g., over) sidewalls of memory cells 360 that are respectively over the adjacent active regions 325. For some embodiments, a sidewall of a memory cell 360 in a row a memory cells 360 may be formed by the edges of a dielectric 304, a charge-storage structure 308, and a dielectric 312, as shown in FIG. 3B.

For some embodiments, the portion of an air gap 480 that is between about the level indicated by arrow 357 in FIG. 3B and the bottom of the portion of dielectric 332 remaining under dielectric 340 may correspond to the region 460 in FIG. 4C. Region 460 is vertically under dielectric 340, i.e., between dielectric 340 and the lower ends of the sidewall spacers of protective material 440, and between the sidewall spacers of protective material 440, as shown in FIG. 4C. Note that this portion of the respective air gap 480 corresponds to the portion of opening 370 that is substantially formed by the upward removal of dielectric 332 vertically under the respective stack 420 and between the sidewall spacers of protective material 440.

Note that the upper portion of dielectric 332 may include a portion of region $532_1$, a portion of region $532_2$, or portions of region $532_1$ and region $532_2$ (FIGS. 5A and 5B) for some embodiments. Note that air gaps 480 are between adjacent columns of memory cells 360, may extend substantially in the column direction, e.g., in the data-line (e.g., bit-line) direction, into and out of the face plane of FIG. 3B, and may act to reduce the capacitive coupling between the charge-storage structures of adjacent memory cells 360. Air gaps 475 are between adjacent rows of memory cells, and may extend substantially in the row direction, e.g., in the access-line (e.g., word-line) direction, into and out of the face plane of FIG. 4C. As such, air gaps 475 may intersect air gap 480 and may be substantially perpendicular to air gap 480.

Figure 6A:
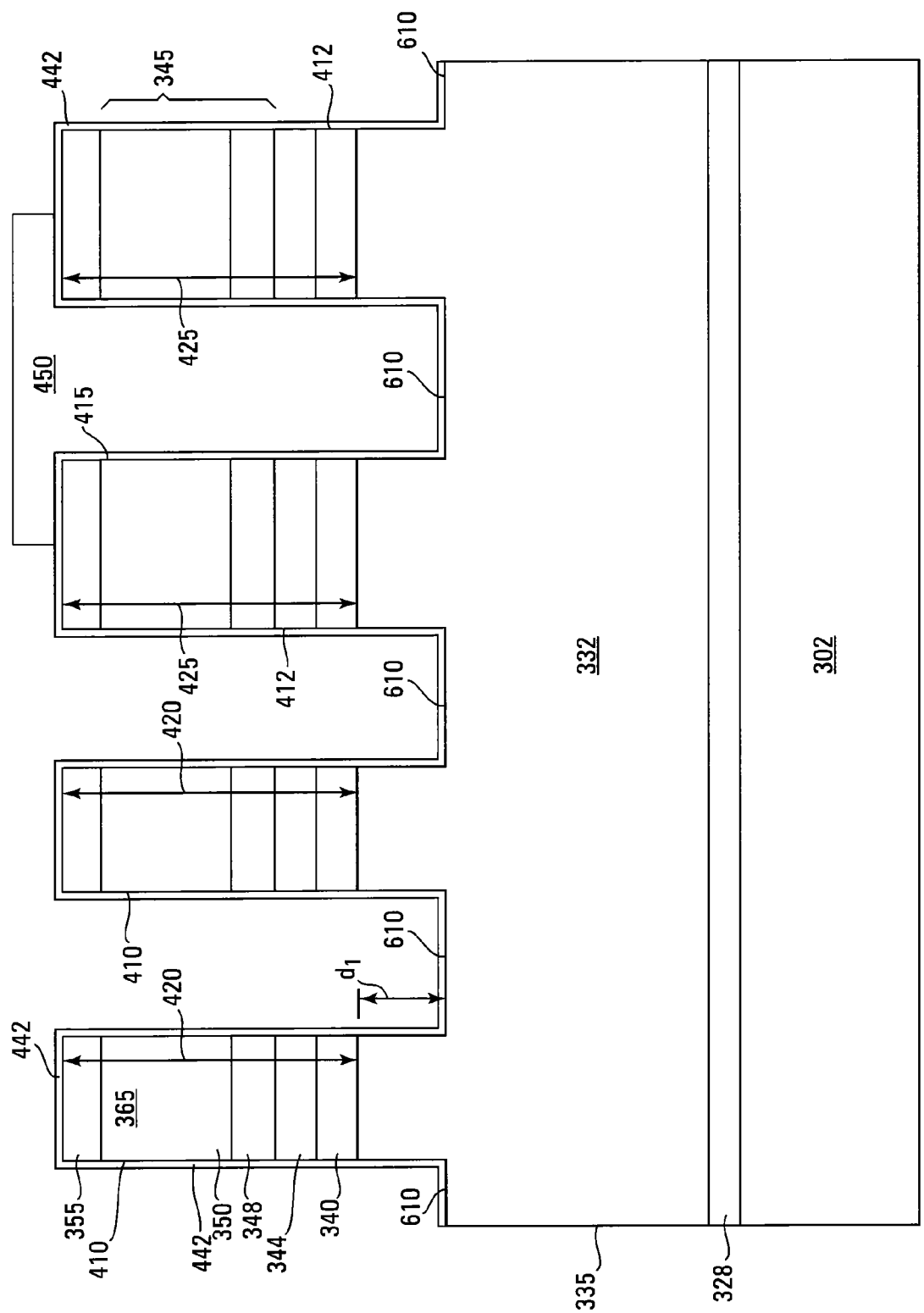
FIGS. 6A-6F are cross-sectional views of a portion of a memory array during various stages of fabrication, according to another embodiment, where
Figure 6B:
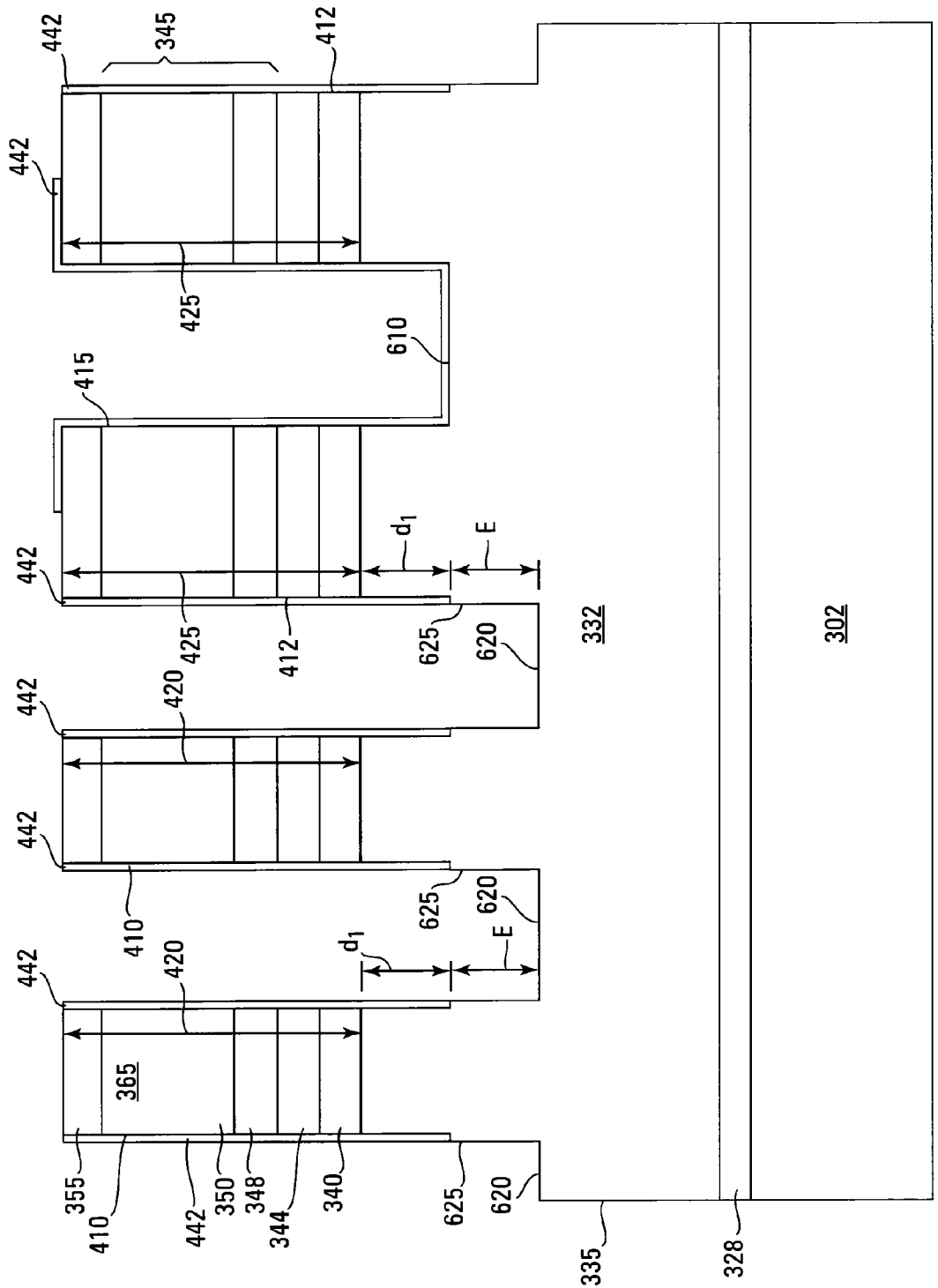
Figure 6C:
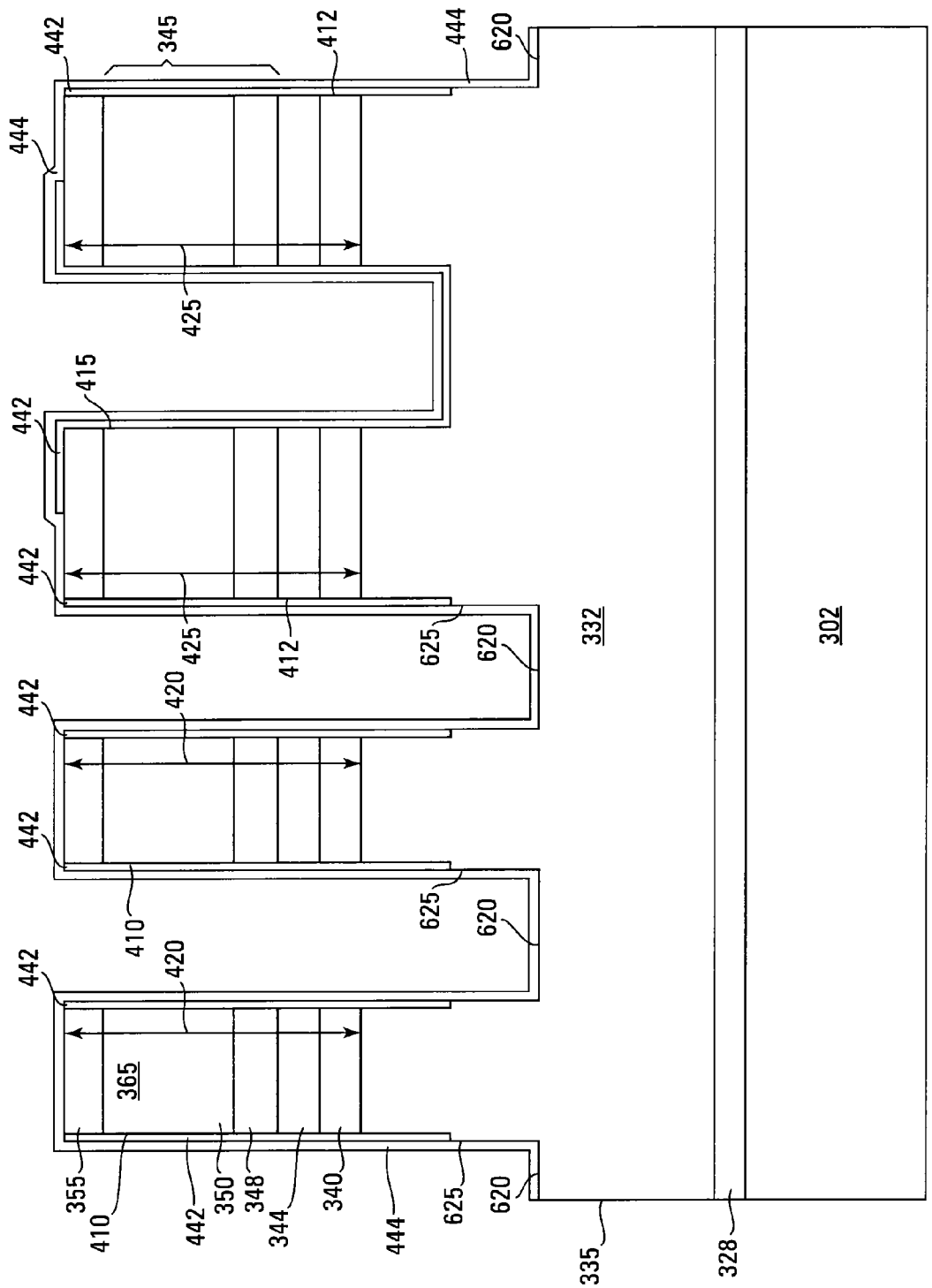
Figure 6D:
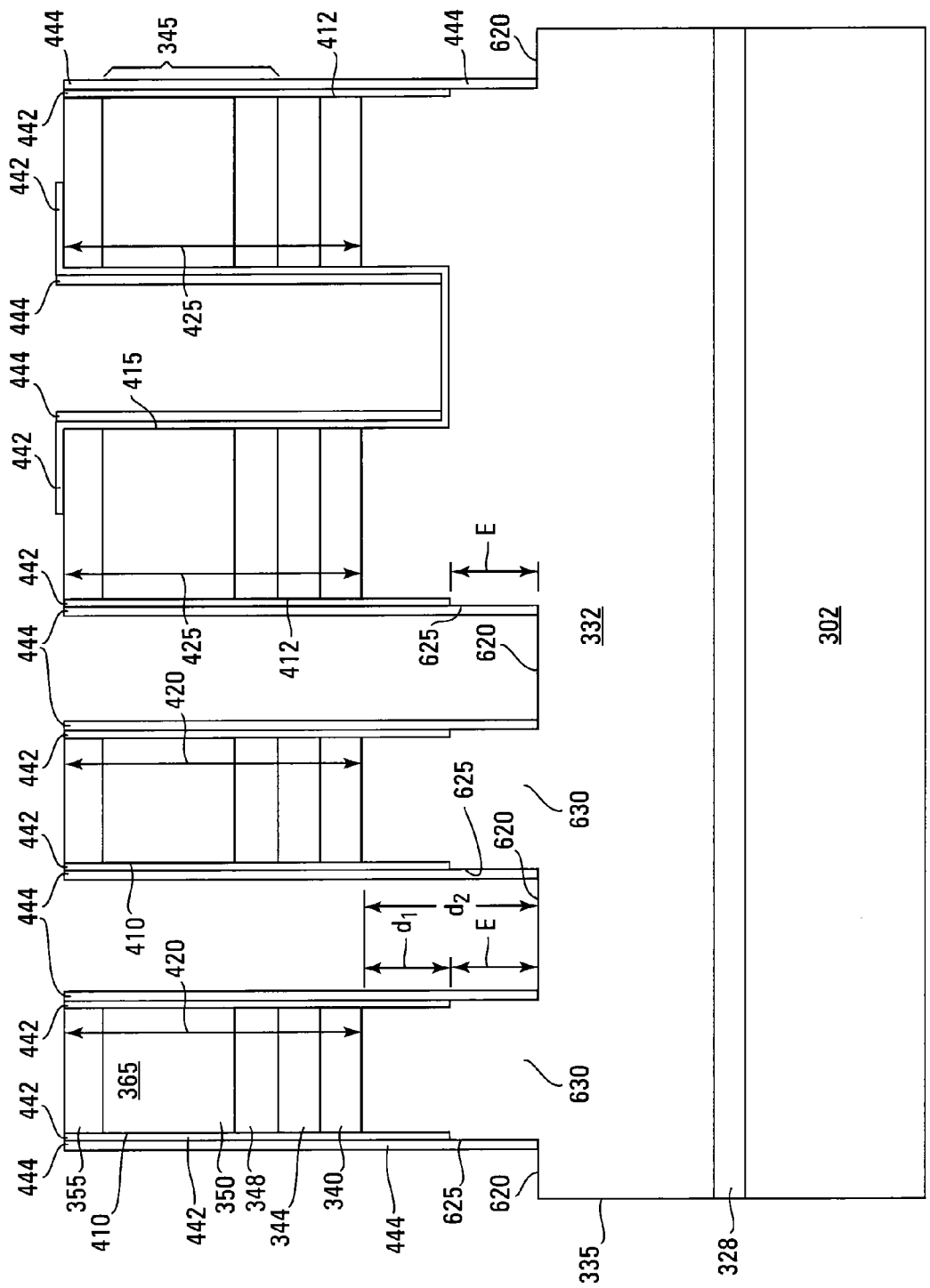
Figure 6E:
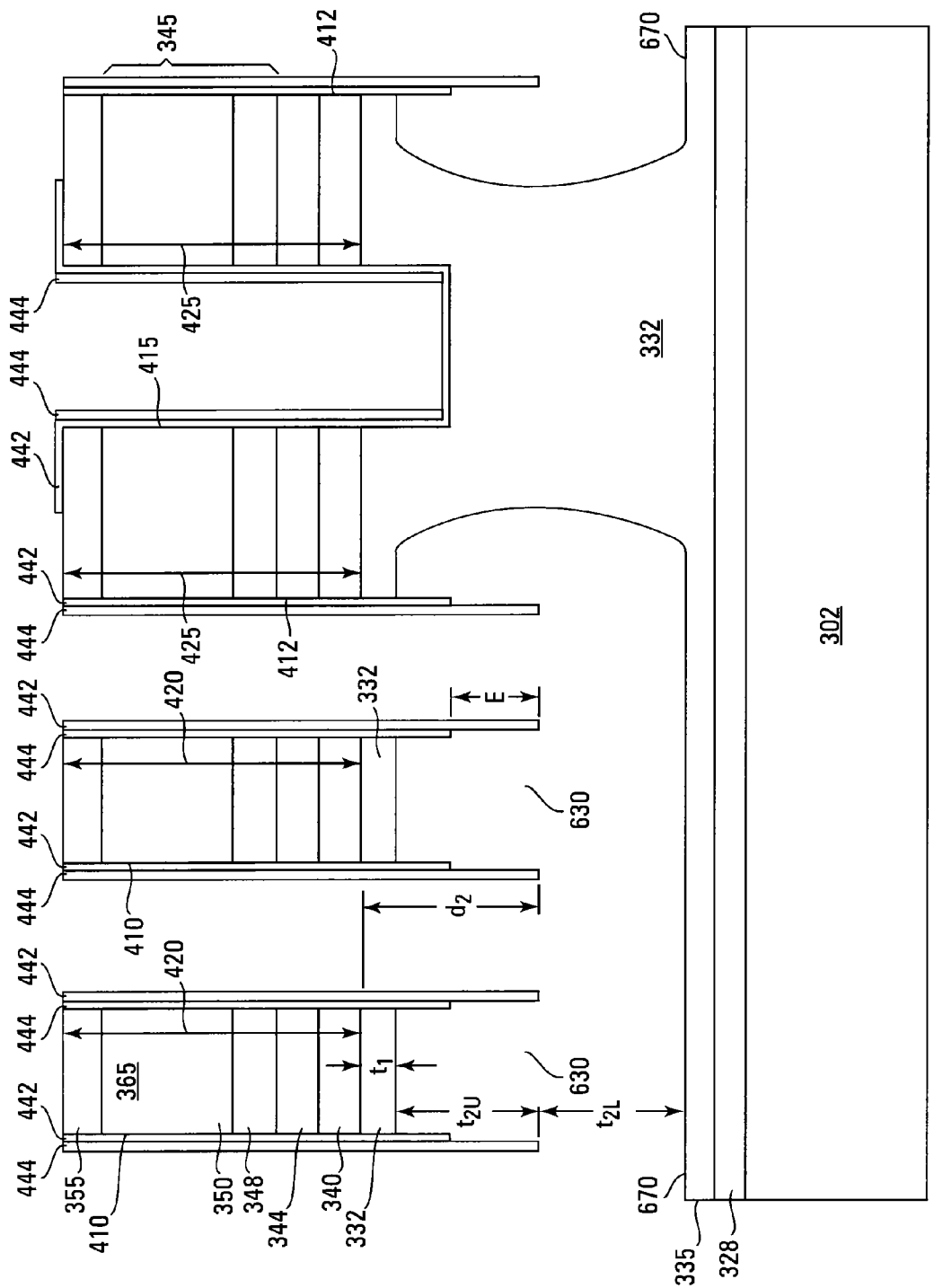
Figure 6F:
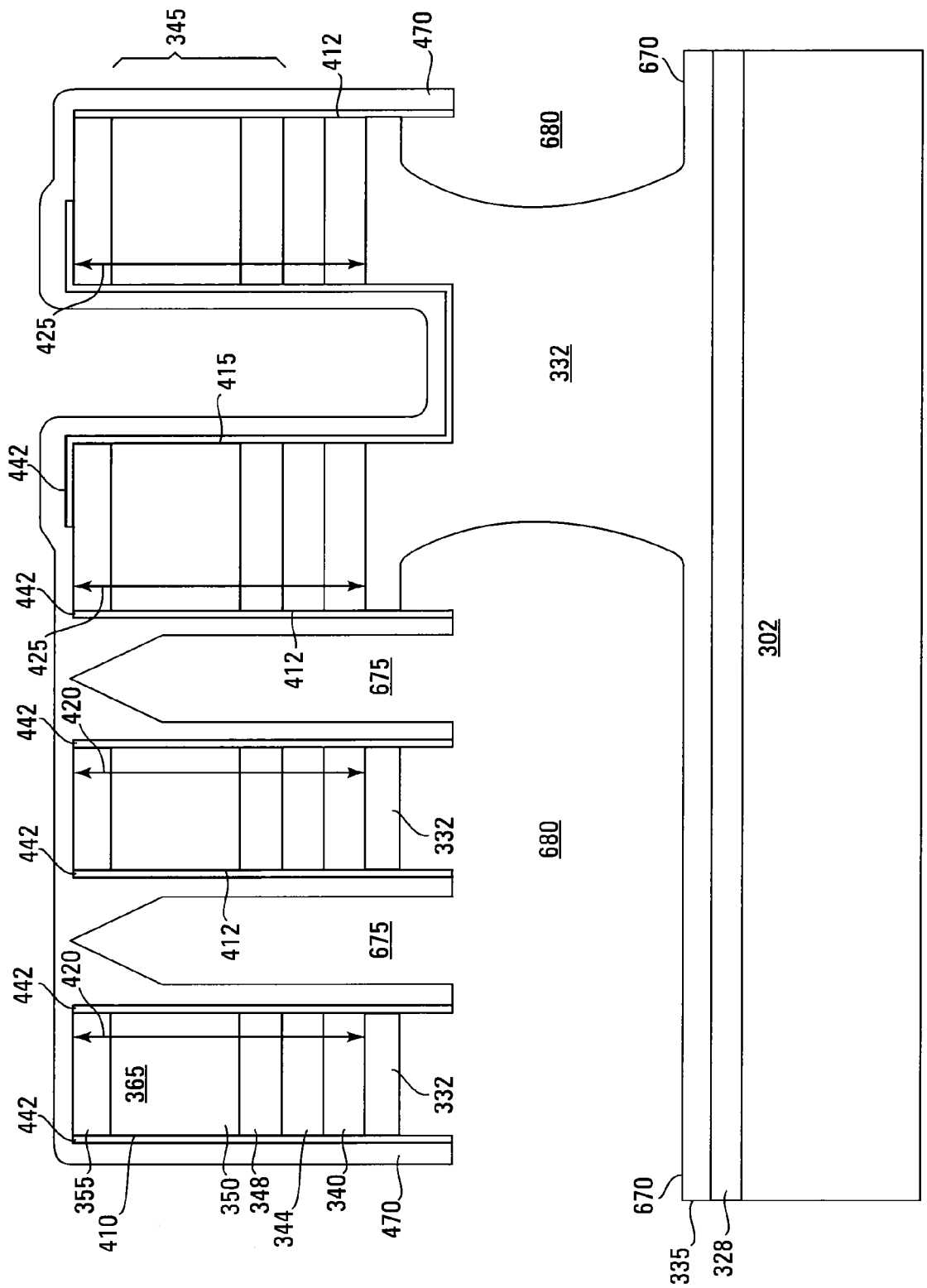
Figure 7:
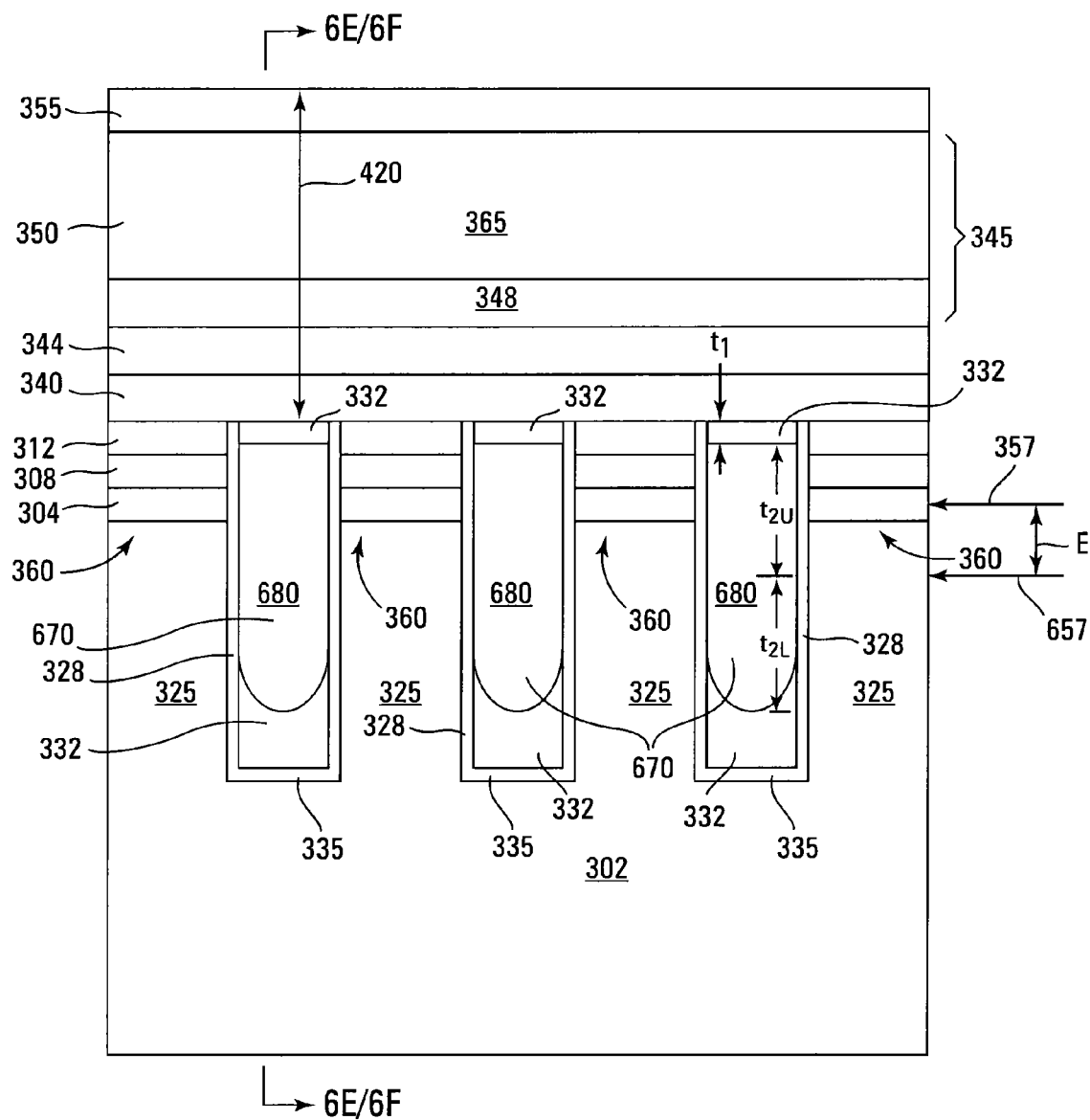
FIG. 7 is cross-sectional view of a portion of a memory array, according to another embodiment.

FIGS. 6A-6F are cross-sectional views of the portion of the memory array depicted in FIGS. 3A and 7, such as a portion of memory array 200 of FIG. 2, e.g., along a data-line (e.g., bit-line) direction, such as a column direction, during various stages of fabrication. FIGS. 6A-6D show cross-sections viewed along line 4/6-4/6 in FIG. 3A during the various stages of fabrication, and FIGS. 6E and 6F show cross-sections viewed along line 6E/6F-6E/6F in FIG. 7. FIGS. 4A-4C and FIGS. 6A-6F use common numbering to denote similar or substantially the same (e.g., the same) elements, as do FIGS. 3A and 3B and FIG. 7.

In the example of FIG. 6A, after openings 410, 412, and 415 are formed and the thickness of protective material (e.g., a protective liner) 442 is formed, as described above in conjunction with FIG. 4A, mask 450 may then be formed within opening 415 over the thickness of protective material 442 and may extend over at least a portion of the thickness of protective material 442 formed over the upper surfaces of stacks 425, as described above in conjunction with FIG. 4A.

Openings 410, 412, and 415 may terminate at surfaces 610 in FIG. 6A, e.g., at the distance $d_1$ below dielectric 340 and thus stacks 420 and 425. Surfaces 610 may be substantially at the level indicated by arrow 357 in FIG. 3A. That is, surfaces 610 may be at a level between the upper and lower surfaces of dielectric 304 in FIG. 3A.

Portions of the thickness of protective material 442 are selectively (e.g., anisotropically) removed, e.g., by an anisotropic etch, such as an anisotropic dry etch, and mask 450 is subsequently removed, as shown in FIG. 6B. For example, with mask 450 in place, the substantially horizontal portions the thickness of protective material 442 are selectively removed from the upper surfaces of stacks 420 and 425 and the bottoms of openings 410 and 412, leaving behind the substantially vertical portions of the thickness of protective material 442 (e.g., that may be referred to as protective sidewall spacers of protective material 442) over (e.g., on) the side surfaces of stacks 420 and 425 and side surfaces of dielectric 332, e.g., on the sides of openings 410 and 412, as shown in FIG. 6B. In the example of FIG. 6B, the thickness of protective material 442 remains on the side surfaces of dielectric 340, dielectric 344, conductive material 348 of conductor 345, conductive material 350 of conductor 345, and protective material 355 within openings 410, 412, and 415.

The removal process also selectively removes the exposed portion of the thickness of protective material 442 over the upper surface of each stack 425, leaving behind the portion of the thickness of protective material 442 on the upper surface of each stack 425 that was protected by mask 450. The removal of the substantially horizontal portions of the thickness of protective material 442 from the bottoms of openings 410 and 412 exposes surfaces 620 of dielectric 332, and thus isolation region 335. Surfaces 620 of dielectric 332 are located at a level (e.g., a vertical level) that is below the vertical level of surfaces 610 in FIG. 6A at about the level indicated by arrow 657 in FIG. 7, e.g., at a level below dielectric 304 in FIG. 7.

The removal of the substantially horizontal portions of the thickness of protective material 442 from the bottoms of openings 410 and 412 exposes dielectric 332, e.g., at about surfaces 610 (FIG. 6A), while mask 450 prevents the thickness of protective material 442 in opening 415 from being removed. After the removal of the substantially horizontal portions of the thickness of protective material 442 from the bottoms of openings 410 and 412, the selective removal may continue past the lower ends of the sidewall spacers of protective material 442 to selectively remove the exposed dielectric 332 below the lower ends of the sidewall spacers of protective material 442, stopping at surfaces 620 within dielectric 332.

Surfaces 620 may be at a level (e.g., a vertical level) below the level of the surface 610 of the bottom of opening 415 and the lower ends of the sidewall spacers of protective material 442, and thus below the level indicated by arrow 357 in FIG. 3A. For example, surfaces 620 may be at about the level indicated by arrow 657 in FIG. 7, e.g., at a level below dielectric 304 in FIG. 7. Note that the lower ends of the sidewall spacers of protective material 442 on the sides of openings 410 and 412 may be substantially at the level of surface 610 in opening 415 and the level indicated by arrow 357 in FIG. 3A.

For some embodiments, the selective removal of the substantially horizontal portions of the thickness of protective material 442 from the bottoms of openings 410 and 412 and the selective removal of a thickness of dielectric 332 below the lower ends of the sidewall spacers of protective material 442 may be accomplished in a single removal process step, e.g., using the same etch chemistry. Alternatively, the selective removal of the substantially horizontal portions the thickness of protective material 442 from the bottoms of openings 410 and 412 and the selective removal of dielectric 332 below the lower ends of the sidewall spacers of protective material 442 may be separate removal process steps, e.g., using different etch chemistries.

The selective removal process may selectively, e.g., anisotropically, extend the depth of openings 410 and 412 by a distance E below the level of surfaces 610 (FIGS. 6A and 6B) and the lower ends of the sidewall spacers of protective material 442 into dielectric 332. In other words, the selective removal process forms extensions 625 in openings 410 and 412 that extend the distance E below the lower ends of the sidewall spacers of protective material 442 to form extended openings 410 and 412. Note that dielectric 332 forms the sides and bottom (surface 620) of each extension 625. The distance E corresponds to a thickness of dielectric 332 that is selectively removed below the lower ends of the sidewall spacers of protective material 442 and thus the level of bottom surface 610 of opening 615.

After extending openings 410 and 412, e.g., after the selective removal of dielectric 332 from the openings 410 and 412, mask 450 may be removed. Mask 450 protects the portion (e.g., the substantially horizontal portion) of the dielectric thickness 442 at the bottom of opening 415 between stacks 425 and protects the portion of dielectric 332 thereunder from being removed during the selective removal process.

A thickness of protective material (e.g., a protective liner) 444 is then formed over (e.g., on) the thickness of protective material 442 on the sides of extended openings 410 and 412 (e.g., of the sidewall spacers of protective material 442) and the sides of opening 415, and the thickness of protective material 442 over a portion of the upper surface of each gate stack 425, as shown in FIG. 6C. The thickness of protective material 444 is also formed over (e.g., on) the exposed portions of dielectric 332, and thus isolation region 335. For example, the thickness of protective material 444 is formed over (e.g., on) the sides of extensions 625 of extended openings 410 and 412 and the surfaces 620 forming the bottoms of extensions 625. The thickness of protective material 444 is further formed over (e.g., on) the portion of the upper surfaces of stacks 425 (e.g., over the upper surfaces of protective material 355) not covered by the thickness of protective material 442.

Portions of the thickness of protective material 444 are selectively (e.g., anisotropically) removed, e.g., by an anisotropic etch, such as an anisotropic dry etch to form the structure of FIG. 6D. For example, the substantially horizontal portions the thickness of protective material 444 are selectively removed from the upper surfaces of stacks 420 and 425 and the bottoms of extended openings 410 and 412, leaving behind the substantially vertical portions of the thickness of protective material 444 (e.g., that may be referred to as extended protective sidewall spacers of protective material 444) over (e.g., on) the substantially vertical portions of the thickness of protective material 442 (e.g., the sidewall spacers of protective material 442) on the sides of openings 410, 412, and 415, as shown in FIG. 6D. The protective sidewall spacers of protective material 442 with protective extended sidewall spacers of protective material 444 thereon may be referred to as a protective sidewall spacer.

The extended sidewall spacers of protective material 444 are also formed over (e.g., on) the portions of dielectric 332 forming the sides of extensions 625 of the extended openings 410 and 412 adjacent to the surfaces 620 forming the bottoms extensions 625, and thus of the extended openings 410 and 412. That is, the extended sidewall spacers of protective material 444 extend into extended openings 410 and 412 by substantially the distance E past the ends of the sidewall spacers of protective material 442 on the sides of extended openings 410 and 412 and over the portions of dielectric 332 forming the sides of extensions 625 of the extended openings 410 and 412.

The selective removal process also selectively removes the substantially horizontal portions of the thickness of protective material 444 over the substantially horizontal portions of the thickness of protective material 442 over the portion of the upper surface of each stack 425. Note that the selective removal process may stop on or in the substantially horizontal portion of the thickness of protective material 442 at the bottom of opening 415 between stacks 425. That is, the thickness of protective material 442 at the bottom of opening 415 protects the dielectric 332 under, e.g., vertically under, that thickness of protective material 442 from being removed by the selective removal process.

In the example of FIG. 6A, the distance $d_1$ between the lower surface of dielectric 340 and a surface 610 corresponds to the thickness of dielectric 332 vertically under dielectric 340 and between protective sidewall spacers of protective material 442, e.g., in region 630, at that point in the process. In the example of FIG. 6D, the distance $d_2$ (e.g., the distance $d_1$ plus the distance E) between the lower surface of dielectric 340 and a surface 620 corresponds to the thickness of dielectric 332 in region 630 at that point in the process. Extending openings 410 and 412 to a greater depth increases the amount of dielectric 332 available in region 630 for upward removal before encroaching upon dielectric 340 during a subsequent isotropic removal process.

The removal of the thickness of protective material 444 from the bottoms of extended openings 410 and 412 provides access to dielectric 332 through extended openings 410 and 412 for the removal of a portion of dielectric 332. A portion of dielectric 332 is then removed, e.g., using an isotropic removal process, such as an isotropic wet etch (e.g., when dielectric 332 is a spin-on-dielectric, such as hydrogen silsesquioxane (HSQ), perhydropolysilazane, etc.) or an isotropic dry etch (e.g., when dielectric 332 is a carbon-rich oxide). For some embodiments, the isotropic wet etch may use 100:1 hydrofluoric acid (HF), whereas the isotropic dry etch may use oxygen-rich plasma, e.g., with 10 to 100 percent oxygen by volume.

The isotropic removal process removes dielectric 332 vertically and laterally to remove dielectric 332 from under extended openings 410 and 412 and under gate stacks 420 in the regions 630 and from under at least a portion of gate stacks 425, as shown in FIG. 6E. The isotropic removal process extends upward in regions 630 under gate stacks 420 under gate stacks 425, as well as downward, so as to remove at least some of the dielectric 332 vertically under dielectric 340 and between the protective sidewall spacers of protective material 444 and the protective sidewall spacers of protective material 442.

The isotropic removal process forms openings 670 in dielectric 332, as shown in FIGS. 6E and 7. For example, the upward and downward removal of dielectric 332 in regions 630 vertically under stacks 420 forms the openings 670 shown in FIG. 7. Note that extended openings 410 and 412 may open into an opening 670 and may be contiguous with that opening 670.

For some embodiments, the thickness $t_1$ of dielectric 332 is allowed to remain under each stack 420, e.g., under dielectric 340, in regions 630 as shown in FIGS. 6E and 7, e.g., for protecting the respective stacks 420. A portion of dielectric 332 is also allowed to remain under each stack 425, e.g., under dielectric 340, as shown in FIG. 6E, e.g., for protecting the respective stacks 425. For example, the thickness of dielectric 332 remaining under each stack 420 may be in region 630 vertically under dielectric 340 and between the protective sidewall spacers of protective material 444 and between the protective sidewall spacers of protective material 442, as shown in FIG. 6E.

During the isotropic removal, the thickness $t_{2U}$ of dielectric 332 is removed in a upward removal and the thickness $t_{2L}$ of dielectric 332 is removed in a downward removal, as described above in conjunction with FIG. 4C and shown in FIGS. 6E and 7. For example, during the time the thickness $t_{2U}$ of dielectric 332 is removed, the thickness $t_{2L}$ of dielectric 332 is also removed. The isotropic removal may be terminated at a time when the thickness $t_1$ of dielectric 332 is reached, so as to avoid encroaching on dielectric 340.

In the example of FIG. 6E, the distance $d_2$ may be substantially equal to the thickness $t_1$ of dielectric 332 remaining plus the thickness $t_{2U}$ of dielectric 332 removed by the upward removal. Since the distance $d_2$ is the distance $d_1$ plus the distance E and the thickness $t_1$ in FIGS. 4C and 6F may be substantially the same, the thickness $t_{2U}$ of dielectric 332 removed by the upward removal in FIG. 6E is greater than the thickness $t_{2U}$ of dielectric 332 removed by the upward removal in FIG. 4C. This is due to the extending of openings 410 and 412 by the distance E.

Therefore, the removal time upon reaching the thickness $t_1$ of dielectric 332 remaining in region 630 in FIG. 6E is greater than the removal time upon reaching the thickness $t_1$ of dielectric 332 remaining in region 460 in FIG. 4C. This means that the thickness $t_{2L}$ of dielectric 332 that is removed by the downward removal in FIG. 6E is greater, due to the longer isotropic removal time, than the thickness $t_{2L}$ of dielectric 332 that is removed by the downward removal in FIG. 4C. As such, the depth of openings 670 in FIG. 6E, and thus the air gaps 680 in FIGS. 6F and 7 formed from openings 670, are deeper than openings 470 in FIG. 4C, and thus the air gaps 480 in FIGS. 4C and 3B formed from openings 470. For some embodiments, the thickness $t_{2U}$ of dielectric 332 removed from the region 660 by the upward removal and the thickness $t_{2L}$ of dielectric 332 removed in a downward removal may be substantially equal, as shown in FIGS. 6E and 7.

The isotropic removal process also removes a portion of dielectric 332 from between successively adjacent memory cells 360 in each row of memory cells to form an opening 370 between successively adjacent memory cells 360 in each row of memory cells, as shown in the example of FIG. 3B for a portion of a row of memory cells. For example, openings 370 may be formed in isolation regions 335. FIG. 3B shows that the upward removal removes the thickness $t_{2U}$ of dielectric 332, e.g., substantially above the level indicated by arrow 357, from isolation regions 335 and that the downward removal removes the thickness $t_{2L}$ of dielectric 332, e.g., substantially below the level indicated by arrow 357, from isolation regions 335.

The isotropic removal process also removes a portion of dielectric 332 from between successively adjacent memory cells 360 in each row of memory cells to form an opening 670 between successively adjacent memory cells 360, in each row of memory cells, as shown in the example of FIG. 7 for a portion of a row of memory cells. For example, openings 670 may be formed in isolation regions 335. FIG. 7 shows that the upward removal removes the thickness $t_{2U}$ of dielectric 332, e.g., substantially above the level indicated by arrow 657, from isolation regions 335 and that the downward removal removes the thickness $t_{2L}$ of dielectric 332, e.g., substantially below the level indicated by arrow 657, from isolation regions 335.

The lower ends of the protective sidewall spacers of protective material 442 may be at about the level (e.g., vertical level) indicated by arrow 357 in FIG. 7, and lower ends of the protective sidewall spacers of protective material 444 may be at about the level (e.g., vertical level) indicated by arrow 657 in FIG. 7. As such, the levels indicated by arrows 357 and 657 may be separated by about the distance E, as shown in FIG. 7. For some embodiments, the level indicated by arrow 657 may be about halfway between the bottom and the top of the air gaps 680.

Note that the portion of an air gap 680 that is between about the level indicated by arrow 657 in FIG. 7 and the bottom of the portion of dielectric 332 remaining under dielectric 340 corresponds to the region 630 in FIG. 6E. This portion of the respective air gap 680 corresponds to the portion of opening 670 that is substantially formed by the upward removal of dielectric 332 in region 630 vertically under the respective stack 420 and between the sidewall spacers of protective material 444 on the side surfaces of that stack 420.

Note that the etchant is supplied to dielectric 332 though extended openings 410 and 412 while the side surfaces of stacks 410 and a side surface of each of stacks 425 are protected with the thickness of protective material 444. Dielectric 332 may be selected to have a higher removal rate than the thickness of protective material 444 and dielectric 328 (FIG. 7) for the particular removal process, such as the wet or dry etch, so that at least a portion of dielectric 332 can be removed while leaving the thickness of protective material 444 on the side surfaces of stacks 420, leaving the thickness of protective material 444 on the side surfaces and at least a portion of the upper surfaces of stacks 425, and leaving dielectric 328 on the side surfaces of at least dielectrics 304 and 312 and charge storage structures 308, as shown in FIG. 7. In this way, the thickness of protective material 444 protects the side surfaces of stacks 420 and the side surfaces and at least the portion of the upper surfaces of stacks 425; dielectric 328 protects at least the side surfaces of dielectrics 304 and 312 and charge storage structures 308; and protective material 355 protects the upper surfaces of conductor 350, e.g., word lines 365.

Subsequently, for some embodiments, the thickness of protective material 444 may be selectively removed from the sides of extended openings 410 and 412 and from the sides of opening 415, leaving the thickness of protective material 442, as shown in FIG. 6F. For example, a wet etch selective to the thickness of protective material 444 may accomplish this. Alternatively, the thickness of protective material 444 may be allowed to remain.

Material 470 is then formed in openings 410 and 412, with or without (FIG. 6F) the thickness of protective material 444, so that material 470 closes openings 410 and 412 adjacent to the tops thereof. For some embodiments, a thickness of material 470 may form over the sidewall spacers of protective material 442 that are on the sides of openings 410 and 412.

Closing openings 410 and 412 at their tops forms air gaps 675 that may open into (e.g., communicate with) an opening 370. Each opening 370 may also form an air gap 680 that may communicate with air gaps 675. As such, air gaps 675 and 680 may be contiguous and may be thought of as forming a single air gap. For example, an air gap may include an air gap 675 and a portion of air gap 680.

For each row of memory cells, an air gap 680 may at least be between the dielectrics 304 (e.g., corresponding to the tunnel dielectrics), between the charge storage structures 308, and between dielectrics 312 of successively adjacent memory cells 360 in a row of memory cells, as shown in FIG. 7. Air gaps 675 may be between successively adjacent stacks 410 and between a stack 420 and a successively adjacent stack 425, as shown in FIG. 6F. Note that air gaps 680 are between adjacent columns of memory cells 360, e.g., in the data-line (e.g., bit-line) direction, extending into and out of the face plane of FIG. 7 and act to reduce the capacitive coupling between the charge-storage structures of adjacent memory cells 360.

The presence of extensions 625 in extended openings 410 and 412 and the extended sidewall spacer of protective material 444 on the sides thereof (FIG. 6E) facilitate deeper air gaps, e.g., air gaps that extend to greater distance below dielectric 304 (e.g., the tunnel dielectric of memory cells 360) in FIG. 7. Deeper air gaps may result in better memory cell performance, owing to lower capacitance associated with deeper air gaps.

In the examples of FIGS. 6D-6E and FIG. 7, the extended sidewall spacers of protective material 444 on the sides of extensions 625 (FIG. 6E), extending to a level (e.g., vertical level) below the level indicated by arrow 357 in FIG. 3A, e.g., to a level below dielectric 304, allows for more dielectric 332 between the lower ends of the extended sidewall spacers of protective material 444 and dielectric 340. This enables dielectric 332 to be removed to a greater depth below the lower ends of the extended sidewall spacers of protective material 444 before the isotropic removal process, forming openings 670 and thus air gaps 680, can reach dielectric 340 above the lower ends of the extended sidewall spacers of protective material 444. For example, the isotropic removal process may remove dielectric 332 above and below the lower ends of the extended sidewall spacers of protective, material 444 at about the same rate. As such, air gaps 680 can be formed to a greater depth while keeping the length of time that the isotropic etchant is adjacent to dielectric 304, charge-storage structure 308, dielectric 312, and dielectric 340 to an acceptable limit.

Note that varying the distance E by which extensions 625 extend openings 410 and 412 allows the depth of the air gaps to be varied and thus allows the air gaps to be tuned for obtaining particular memory cell properties. In other words, varying the distance E by which the extended sidewall spacers of protective material 444 extend past the ends of the sidewall spacers of protective material 442 allows the depth of the air gaps to be varied. For example, varying the distance E from zero, no extensions 625, as is the case for FIGS. 4A-4C and FIG. 3B, to the distance E in FIGS. 6D-6F and FIG. 7, may allow the depth of the air gaps to change from the depth of air gaps 480 in FIG. 3B to the depth of air gaps 680 in FIG. 7.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of forming a memory array, comprising:
   forming an isolation region, comprising a first dielectric, through a charge-storage material that is over a semiconductor, and extending into the semiconductor;
   forming a second dielectric over the isolation region and charge-storage material; and
   forming an air gap in the isolation region so that the air gap passes through the charge-storage material and so that a thickness of the first dielectric is between the air gap and the second dielectric.

2. The method of claim 1, further comprising forming the air gap in the isolation region so that some of the first dielectric is between the semiconductor and the air gap.

3. The method of claim 1, wherein forming the isolation region, comprising a first dielectric, comprises forming the isolation region comprising the first dielectric selected from the group consisting of a spin-on-dielectric, hydrogen silsesquioxane (HSQ), perhydropolysilazane, and carbon-rich oxide.

4. The method of claim 1, wherein forming the isolation region, comprising the first dielectric, comprises forming the first dielectric on a dielectric liner that covers side surfaces of the charge-storage material.

5. The method of claim 1, further comprising forming an access line over the second dielectric before forming the air gap.

6. The memory array of claim 1, wherein the air gap contains one or more gaseous components.

7. The memory array of claim 6, wherein the one or more gaseous components comprise one or more gaseous components selected from the group consisting of ambient air, oxygen, nitrogen, argon, neon, and gases inert to structures surrounding the air gap.

8. The memory array of claim 6, wherein the one or more gaseous components are below atmospheric pressure.

9. A method of forming a memory array, comprising:
   forming a first dielectric over a semiconductor;
   forming a charge-storage material over the first dielectric;
   forming an isolation region, comprising a second dielectric, through the first dielectric and the charge-storage material, and extending into the semiconductor;
   forming an access-line stack over the isolation region;
   forming protective sidewall spacers on side surfaces of the access-line stack that extend into the second dielectric; and
   removing the second dielectric between the protective sidewall spacers, leaving a thickness of the second dielectric vertically under the access-line stack between the protective sidewall spacers, so as to form an air gap in the isolation region that passes through the charge-storage material and that is between the thickness of the second dielectric and the semiconductor.

10. The method of claim 9, wherein forming the access-line stack comprises:
    forming a third dielectric over the charge-storage structure and the isolation region; and
    forming a conductor over the third dielectric.

11. The method of claim 9, wherein forming the protective sidewall spacers on the side surfaces of the access-line stack comprises:
   forming one or more thicknesses of protective material in openings adjacent to the side surfaces of the access-line stack; and
   anisotropically removing the one or more thicknesses of protective material from bottoms of the openings to expose a portion of the second dielectric at the bottom the openings.

12. The method of claim 11, wherein the openings adjacent to the side surfaces of the access-line stack are first openings, and further comprising:
   forming a pair of select-line stacks over the isolation region;
   forming the one or more thicknesses of the protective material in a second opening between the select-line stacks; and
   preventing the one or more thicknesses of the protective material from being removed from a bottom of the second opening while anisotropically removing the one or more thicknesses of protective material from bottoms of the first openings.

13. The method of claim 12, further comprising using the one or more thicknesses of the protective material on the bottom of the second opening to substantially prevent the second dielectric from being removed under the second opening while removing the second dielectric between the protective sidewall spacers.

14. The method of claim 12, further comprising forming a material in the first openings and the second opening so that the material closes off the first openings.

15. The method of claim 9, wherein removing the second dielectric between protective sidewall spacers comprises:
   anisotropically removing a first portion of the second dielectric adjacent to bottoms of openings that are adjacent to the access-line stack to expose a second portion of the second dielectric under the first portion of the second dielectric; and
   isotropically removing the exposed second portion;
   wherein the first portion of the second dielectric is hardened with respect to the second portion of the second dielectric.

16. The method of claim 15, wherein isotropically removing the exposed second portion further removes a portion of the first portion.

17. The method of claim 9, wherein forming the protective sidewall spacers on the side surfaces of the access-line stack comprises:
   forming protective sidewall spacers of a first protective material on the side surfaces of the access-line stack that extend to a first vertical level in the second dielectric; and
   forming extended protective sidewall spacers of a second protective material on the protective sidewall spacers of the first protective material so that the extended protective sidewall spacers of the second protective material extend to a second vertical level in the second dielectric that is lower than the first vertical level.

18. The method of claim 9, wherein forming the protective sidewall spacers on the side surfaces of the access-line stack comprises:
   forming a thickness of a first protective material on the side surfaces of the access-line stack and in openings adjacent to the side surfaces of the access-line stack that extend to a first vertical level in the second dielectric;
   selectively removing the thickness of the first protective material from bottoms of the openings to expose the second dielectric at substantially the first vertical level at the bottoms of the openings and to form protective sidewall spacers of the first protective material on the side surfaces of the access-line stack that extend to substantially the first vertical level;
   after selectively removing the thickness of the first protective material from bottoms of the openings, selectively removing the exposed second dielectric at the bottom of the openings to form extended openings, terminating at a second vertical level in the second dielectric;
   forming a thickness of a second protective material in the extended openings and on the protective sidewall spacers of the first protective material; and
   selectively removing the thickness of the second protective material from bottoms of the extended openings to expose the second dielectric at substantially the second vertical level at the bottom the extended openings and to form protective sidewall spacers of the second protective material on the protective sidewall spacers of the first protective material that extend past the protective sidewall spacers of the first protective material to substantially the second vertical level.

19. The method of claim 18, wherein selectively removing the thickness of the first protective material from bottoms of the openings and selectively removing the second dielectric at the bottom the openings, comprises selectively removing the thickness of the first protective material from bottoms of the openings and selectively removing the second dielectric at the bottom the openings in a single removal process step.

20. The method of claim 18, wherein selectively removing the thickness of the first protective material from bottoms of the openings and selectively removing the second dielectric at the bottom the openings, comprises selectively removing the thickness of the first protective material from bottoms of the openings and selectively removing the second dielectric at the bottom the openings using different etch chemistries.

21. A method of forming a memory array, comprising:
   forming an isolation region extending into a semiconductor;
   forming a plurality of access-line stacks and select-line stacks over the isolation region;
   forming a protective liner in first openings between adjacent access-line stacks and in a second opening between adjacent select-line stacks;
   forming a mask over the protective liner in the second opening;
   anisotropically removing the protective liner from the bottoms of the first openings, leaving a portion of the protective liner on sides of the first openings and exposing a dielectric in the isolation region at the bottoms of the first openings;
   removing the mask;
   isotropically removing the dielectric exposed at the bottoms of the first openings so as to form a third opening in the dielectric that extends under the access-line stacks; and
   forming a material in the first openings and the second opening so that the material closes off the first openings;
   wherein the closed off first openings and the third opening are contiguous and form an air gap in the isolation region.

22. The method of claim 21, further comprising using the mask to prevent the protective liner in the second opening from being removed while anisotropically removing the protective liner from the bottoms of the first openings.

23. The method of claim 21, wherein forming the protective liner comprises treating the protective liner with a decoupled plasma nitridation process.

24. The method of claim 21, wherein forming the protective liner comprises:
 forming an oxide in the first openings between adjacent access-line stacks and in the second opening between adjacent select-line stacks; and
 forming a nitride over the oxide.

25. The method of claim 21, wherein isotropically removing the dielectric exposed at the bottoms of the first openings comprises terminating the isotropic removal when a portion of the dielectric vertically under the access-line stacks is deemed to reach a certain thickness.

26. A method of forming a memory array, comprising:
 forming an isolation region extending into a semiconductor;
 forming a plurality of access-line stacks and select-line stacks over the isolation region;
 forming a first thickness of protective material in first openings between adjacent access-line stacks and in a second opening between adjacent select-line stacks;
 forming a mask over the first thickness of protective material in the second opening;
 while using the mask to prevent the first thickness of protective material in the second opening from being removed, anisotropically removing the first thickness of protective material from the bottoms of the first openings to form sidewall spacers of the first thickness of protective material on sides of the first openings and to expose a thickness of a dielectric of the isolation region at bottoms of the first openings;
 while using the mask to prevent the first thickness of protective material in the second opening from being removed, anisotropically removing the exposed thickness of the dielectric of the isolation region to form extended first openings that extend into the dielectric of the isolation region below lower ends of the sidewall spacers of the first thickness of protective material and that expose the dielectric of the isolation region below the lower ends of the sidewall spacers of the first thickness of protective material;
 removing the mask;
 forming a second thickness of protective material over the first thickness of protective material in the second opening, on the sidewall spacers of the first thickness of protective material in the extended first openings, and over the exposed dielectric of the isolation region below the lower ends of the sidewall spacers of the first thickness of protective material in the extended first openings;
 anisotropically removing the second thickness of protective material from the bottoms of the extended first openings to expose the dielectric of the isolation region at the bottoms of the extended first openings and to form extended sidewall spacers of the second thickness of protective material in the first openings over the sidewall spacers of the first thickness of protective material and extending below the lower ends of the sidewall spacers of the first thickness of protective material;
 isotropically removing the dielectric of the isolation region exposed at the bottoms of the extended first openings so as to form a third opening in the dielectric of the isolation region that extends under the access-line stacks; and
 forming a material in the extended first openings and the second opening so that the material closes off the extended first openings;
 wherein the closed off extended first openings and the third opening are contiguous and form an air gap in the isolation region.

27. The method of claim 26, further comprising after isotropically removing the dielectric exposed at the bottoms of the extended first openings and before forming the material in the extended first openings and the second opening, selectively removing the extended sidewall spacers of the second thickness of protective material from the first openings and the second thickness of protective material from the second opening.

28. The method of claim 26, wherein isotropically removing the dielectric of the isolation region exposed at the bottoms of the extended first openings comprises isotropically removing an amount of dielectric vertically under the access-line stacks that is determined, at least in part, by a distance that the extended sidewall spacers of the second thickness of protective material extend below the lower ends of the sidewall spacers of the first thickness of protective material.

* * * * *

UNITED STATES PATENT AND TRADEMARK OFFICE
CERTIFICATE OF CORRECTION

| | |
|---|---|
| PATENT NO. | : 8,569,130 B2 |
| APPLICATION NO. | : 13/192763 |
| DATED | : October 29, 2013 |
| INVENTOR(S) | : James Matthew et al. |

Page 1 of 1

It is certified that error appears in the above-identified patent and that said Letters Patent is hereby corrected as shown below:

In the Claims

In column 23, line 9, in Claim 11, delete "bottom" and insert -- bottom of --, therefor.

In column 24, line 19, in Claim 18, delete "bottom" and insert -- bottom of --, therefor.

In column 24, line 28, in Claim 19, delete "bottom" and insert -- bottom of --, therefor.

In column 24, line 31, in Claim 19, delete "bottom" and insert -- bottom of --, therefor.

In column 24, line 35, in Claim 20, delete "bottom" and insert -- bottom of --, therefor.

In column 24, line 38, in Claim 20, delete "bottom" and insert -- bottom of --, therefor.

Signed and Sealed this
Twenty-eighth Day of January, 2014

Michelle K. Lee
*Deputy Director of the United States Patent and Trademark Office*